US007119724B1

United States Patent
Asami

(10) Patent No.: US 7,119,724 B1
(45) Date of Patent: Oct. 10, 2006

(54) ANALOG DIGITAL CONVERTER AND PROGRAM THEREFOR

(75) Inventor: Koji Asami, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/137,862

(22) Filed: May 25, 2005

(51) Int. Cl.
    *H03M 1/06* (2006.01)
(52) U.S. Cl. ...................... 341/118; 341/120
(58) Field of Classification Search ............. 341/118, 341/120, 155, 159, 160
    See application file for complete search history.

(56) References Cited

U.S. PATENT DOCUMENTS

| 5,568,142 | A  * | 10/1996 | Velazquez et al. ........... 341/126 |
| 6,339,390 | B1 * | 1/2002  | Velazquez et al. ........... 341/120 |
| 6,473,013 | B1 * | 10/2002 | Velazquez et al. ........... 341/120 |
| 2003/0135813 | A1 * | 7/2003 | Greenberg et al. .......... 714/796 |
| 2006/0045212 | A1 * | 3/2006 | Ishii et al. ................... 375/340 |
| 2006/0056496 | A1 * | 3/2006 | Smee et al. .................. 375/148 |

OTHER PUBLICATIONS

Japanese Language Office Action for Application No. PCT/JP2006/310499, Dated Jun. 27, 2006 (2 pages).

Asami, K., Tajiri, S.; A method to improve the performance of high-speed waveform digitizing; Proceedings International Text Conference 1999; 1999; Pates: 947-954.

* cited by examiner

*Primary Examiner*—Linh Nguyen
(74) *Attorney, Agent, or Firm*—Osha·Liang LLP

(57) ABSTRACT

There is provided an analog-to-digital conversion apparatus that converts analog signals into digital signals. The analog-to-digital conversion apparatus includes: a plurality of analog-to-digital converters that converts analog signals into digital signals in different timing by a predetermined phase; a plurality of data inserting units that is provided corresponding to the plurality of analog-to-digital converters and outputs zero-inserted data that is made by respectively inserting data with data value zero between the digital data output from the respectively corresponding analog-to-digital converters by a predetermined number; a synthesizing unit that respectively synthesizes the zero-inserted data to generate the digital signal; and a plurality of filter units that is provided corresponding to the plurality of analog-to-digital converters, has filter coefficients based on a frequency characteristic of each of the analog-to-digital converters so that the digital signal generated form the synthesizing unit is a digital signal obtained when the frequency characteristics of the plurality of analog-to-digital converters are the same as one another, and passes through the corresponding zero-inserted data to supply the data to the synthesizing unit.

15 Claims, 18 Drawing Sheets

ANALOG DIGITAL CONVERTER AND PROGRAM THEREFOR

BACKGROUND OF THE INVENTION

1. Field of the Invention

The present invention relates to an analog-to-digital conversion method and an analog-to-digital conversion apparatus for converting an analog signal to a digital signal, and a program making the analog-to-digital conversion apparatus function.

2. Description of Related Art

Conventionally, in case of converting an analog signal into an digital signal, there is known an N-phase (N-way) interleaved analog-to-digital conversion method using N analog-to-digital converters (hereinafter, referred to as ADCs) in order to raise a sampling rate apparently.

However, in the interleaved analog-to-digital conversion method as described above, when some errors are observed in phases of sampling clocks being supplied to each of ADCs and a frequency characteristic of each of ADCs, a frequency spectrum of a digital signal cannot be computed with high precision.

For example, phases of sampling clocks being supplied to each of ADCs have to be different from one another by a predetermined phase. However, it is difficult to move a phase of each of sampling clocks by a predetermined phase precisely. Moreover, although sampling clocks are supplied to each of ADCs with a precise phase, when a frequency characteristic of ADC is not ideal, a variation is observed in sampling timing and a gain in each of ADCs and thus it is difficult to compute a frequency spectrum of a digital signal with high precision.

Therefore, it is an object of the present invention to provide an analog-to-digital conversion apparatus and a program that can solve the foregoing problems. The above and other objects can be achieved by combinations described in the independent claims. The dependent claims define further advantageous and exemplary combinations of the present invention.

SUMMARY OF THE INVENTION

To solve this problem, according to the first aspect of the present invention, there is provided an analog-to-digital conversion apparatus correcting digital signals output from a plurality of analog-to-digital converters that is provided in parallel and samples analog signals in different timing by a predetermined phase. The analog-to-digital conversion apparatus includes: a plurality of data inserting units that is provided corresponding to the plurality of analog-to-digital converters and outputs zero-inserted data that is made by respectively inserting data with data value zero between the digital data output from the respectively corresponding analog-to-digital converters by a predetermined number; a synthesizing unit that respectively synthesizes the zero-inserted data to generate the digital signal; and a plurality of filter units that is provided corresponding to the plurality of analog-to-digital converters, has filter coefficients based on a frequency characteristic of each of the analog-to-digital converters so that the digital signal generated form the synthesizing unit is a digital signal obtained when the frequency characteristics of the plurality of analog-to-digital converters are the same as one another, and passes through the corresponding zero-inserted data to supply the data to the synthesizing unit.

The data inserting unit may respectively insert data with data value zero between the digital data every the predetermined phase. Each of the filter units may have the filter coefficient based on a first correction coefficient of a frequency domain to be multiplied by a signal within the corresponding frequency domain so that a spurious component caused by the frequency characteristics of the plurality of analog-to-digital converters is removed when converting each of the zero-inserted data into the signal within the frequency domain to synthesize the signals.

Each of the filter units may have the filter coefficient that is obtained by performing Fourier inverse transform on the first correction coefficient defined for each division band that is made by dividing a frequency band of the digital signal by the number of the analog-to-digital converters.

Each of the filter units may have the filter coefficient further based on a second correction coefficient to correct a phase error of the signal within the frequency domain, which is caused by multiplying the signal within the frequency domain by the first correction coefficient.

Each of the filter units may have the filter coefficient that is obtained by performing Fourier inverse transform on a coefficient obtained by multiplying the first correction coefficient by the second correction coefficient, the first correction coefficient and the second correction coefficient being respectively defined for each division band that is made by dividing the frequency band of the digital signal by the number of the analog-to-digital converters.

Each of the filter units may have the filter coefficient that is obtained by multiplying a predetermined window function by a coefficient obtained by performing Fourier inverse transform on the coefficient obtained by multiplying the first correction coefficient by the second correction coefficient.

The analog-to-digital conversion apparatus may further include: a Fourier transform unit that respectively converts the filter coefficients of the filter units into frequency characteristics of the frequency domain; an error computing unit that compares the frequency characteristic of each of the filter units with a reference frequency characteristic previously supplied to compute a squared error; and an adjusting unit that adjusts a width of the window function in a frequency axis in regard to the filter coefficient corresponding to the frequency characteristic when the squared error is not within a predetermined range.

The analog-to-digital conversion apparatus may further include: a Fourier transform unit that respectively converts the filter coefficients of the filter units into frequency characteristics of the frequency domain; an error computing unit that compares the frequency characteristic of each of the filter units with a reference frequency characteristic previously supplied to compute a squared error; and an adjusting unit that adjusts a shape of the window function in regard to the filter coefficient corresponding to the frequency characteristics when the squared error is not within a predetermined range.

The analog-to-digital conversion apparatus may further include a plurality of down samplers that is provided corresponding to the plurality of analog-to-digital converters and samples the zero-inserted data output from the corresponding filter units to supply the sampled data to the synthesizing unit.

According to the second aspect of the present invention, there is provided an analog-to-digital conversion apparatus correcting digital signals output from a plurality of analog-to-digital converters that is provided in parallel and samples analog signals in different timing by a predetermined phase. The analog-to-digital conversion apparatus includes: a plurality of data inserting units that is provided corresponding to the analog-to-digital converters besides a predetermined reference analog-to-digital converter among the plurality of analog-to-digital converters and outputs zero-inserted data that is made by respectively inserting data with data value zero between the digital data output from the respectively corresponding analog-to-digital converters by a predetermined number; a synthesizing unit that respectively synthesizes the zero-inserted data; a plurality of first filter units that is provided corresponding to the analog-to-digital converters besides a predetermined reference analog-to-digital converter among the plurality of analog-to-digital converters, has a filter coefficient based on a first correction coefficient of a frequency domain to be multiplied by a signal within the corresponding frequency domain so that a spurious component caused by the frequency characteristics of the plurality of analog-to-digital converters is removed when converting each of the zero-inserted data into the signal within the frequency domain to synthesize the signals, and passes through the corresponding zero-inserted data to supply the data to the synthesizing unit; and a second filter unit that has the filter coefficient based on a second correction coefficient to correct a phase error of the signal within the frequency domain, which is caused by multiplying the signal within the frequency domain by the first correction coefficient, and passes through the data output from the synthesizing unit to generate the digital signal.

According to the third aspect of the present invention, there is provided a program making an analog-to-digital conversion apparatus function to correct digital signals output from a plurality of analog-to-digital converters that is provided in parallel and samples analog signals in different timing by a predetermined phase. The program making the analog-to-digital conversion apparatus function as: a plurality of data inserting units that is provided corresponding to the plurality of analog-to-digital converters and outputs zero-inserted data that is made by respectively inserting data with data value zero between the digital data output from the respectively corresponding analog-to-digital converters by a predetermined number; a synthesizing unit that respectively synthesizes the zero-inserted data to generate the digital signal; and a plurality of filter units that is provided corresponding to the plurality of analog-to-digital converters, has filter coefficients based on a frequency characteristic of each of the analog-to-digital converters so that the digital signal generated form the synthesizing unit is a digital signal obtained when the frequency characteristics of the plurality of analog-to-digital converters are the same as one another, and passes through the corresponding zero-inserted data to supply the data to the synthesizing unit.

According to the fourth aspect of the present invention, there is provided a program making an analog-to-digital conversion apparatus function to correct digital signals output from a plurality of analog-to-digital converters that is provided in parallel and samples analog signals in different timing by a predetermined phase. The program making the analog-to-digital conversion apparatus function as: a plurality of data inserting units that is provided corresponding to the plurality of analog-to-digital converters and outputs zero-inserted data that is made by respectively inserting data with data value zero between the digital data output from the respectively corresponding analog-to-digital converters by a predetermined number; a synthesizing unit that respectively synthesizes the zero-inserted data; a plurality of first filter units that is provided corresponding to the analog-to-digital converters besides a predetermined reference analog-to-digital converter among the plurality of analog-to-digital converters, has a filter coefficient based on a first correction coefficient of a frequency domain to be multiplied by a signal within the corresponding frequency domain so that a spurious component caused by the frequency characteristics of the plurality of analog-to-digital converters is removed when converting each of the zero-inserted data into the signal within the frequency domain to synthesize the signals, and passes through the corresponding zero-inserted data to supply the data to the synthesizing unit; and a second filter unit that has the filter coefficient based on a second correction coefficient to correct a phase error of the signal within the frequency domain, which is caused by multiplying the signal within the frequency domain by the first correction coefficient, and passes through the data output from the synthesizing unit to generate the digital signal.

The summary of the invention does not necessarily describe all necessary features of the present invention. The present invention may also be a sub-combination of the features described above.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
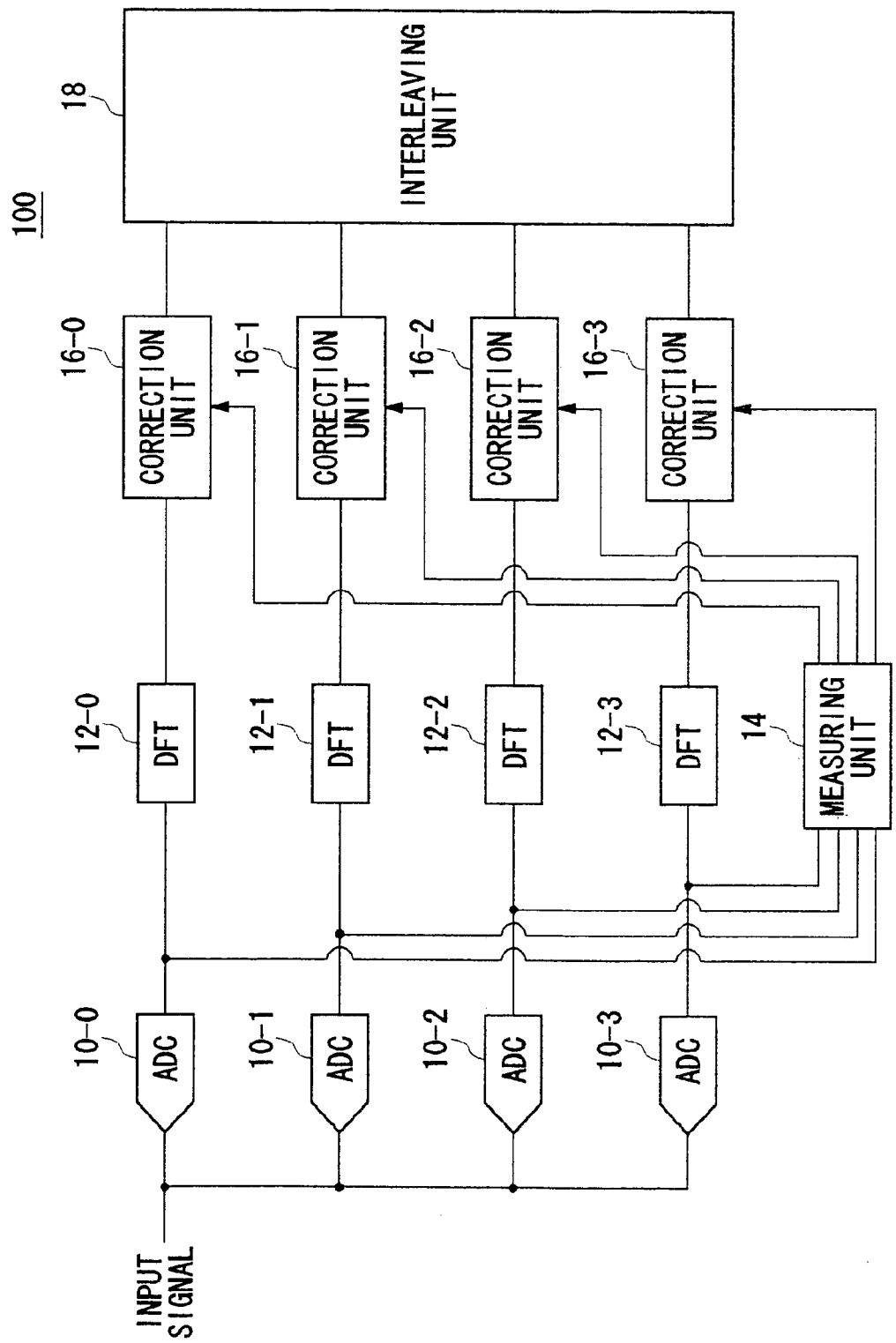
FIG. 1 is a view exemplary showing a configuration of an analog-to-digital conversion apparatus.

FIG. 1 is a view exemplary showing a configuration of an analog-to-digital conversion apparatus 100. The analog-to-digital conversion apparatus 100 is a device that converts an analog signal provided as an input signal into a digital signal, and includes a plurality of ADCs 10-0 to 10-3 (hereinafter, generally referred to as ADC 10), a plurality of Fourier transform units 12-0 to 12-3 (hereinafter, generally referred to as Fourier transform unit 12), a plurality of correction units 16-0 to 16-3 (hereinafter, generally referred to as correction unit 16), a measuring unit 14, and an interleaving unit 18. Moreover, in this example, although the analog-to-digital conversion apparatus 100 converts analog signals into digital signals by means of four ADCs 10, the number of ADCs 10 is not limited to four. For example, the analog-to-digital conversion apparatus 100 may convert analog signals into digital signals by means of $2^n$ pieces (here, n is one or more integer number) of ADC 10. Even in this case, since the analog-to-digital conversion apparatus 100 realizes an operation similar to the analog-to-digital conversion apparatus 100 in this example, it is possible to compute a frequency spectrum of digital signals with high precision.

Sampling clocks having phases different from one another by a predetermined phase are respectively supplied to the ADCs 10. The supplied sampling clocks will be described below referring to FIG. 2. Then, analog signals are supplied to the ADCs 10 as input signals, and are sampled according to the sampling clocks.

The Fourier transform units 12 are respectively provided corresponding to the ADCs 10, respectively perform Fourier transform on data output from the plurality of ADCs 10 by sampling the analog signals, and generate a plurality of frequency domain signals corresponding to the plurality of ADCs 10. The Fourier transform unit 12 performs Fourier transform, e.g., by discrete Fourier transform.

The measuring unit 14 previously measures a frequency characteristic of each of the ADCs 10. For example, the measuring unit 14 makes each of the ADCs 10 input a known analog signal and measures a frequency characteristic of each of the ADCs 10 based on data output from the ADCs 10. At this time, the measuring unit 14 may measure a frequency characteristic of each of the ADCs 10 using sampling clocks obtained when the analog signals are converted into the digital signals. In this way, it is possible to measure a frequency characteristic of sampling performed in each of the ADCs 10, which include a phase error of the supplied sampling clock.

The correction unit 16 multiplies each of the frequency domain signals by correction coefficients based on the frequency characteristics of all ADCs 10 to convert the frequency domain signals into ideal frequency domain signals obtained when frequency characteristics of the corresponding ADCs 10 are ideal. At this time, the frequency characteristic of any one of the ADCs 10 is taken as ideal frequency characteristics. In this way, it is possible to generate ideal frequency domain signals in which a spurious component caused by an error of the frequency characteristic of each of the ADCs 10 is removed.

Moreover, the interleaving unit 18 synthesizes the ideal frequency domain signals, and generates a frequency spectrum of the digital signal. By such a configuration, it is possible to obtain a frequency spectrum in which a spurious component caused by the frequency characteristics of sampling performed in the ADCs 10 is removed.

Figure 2:
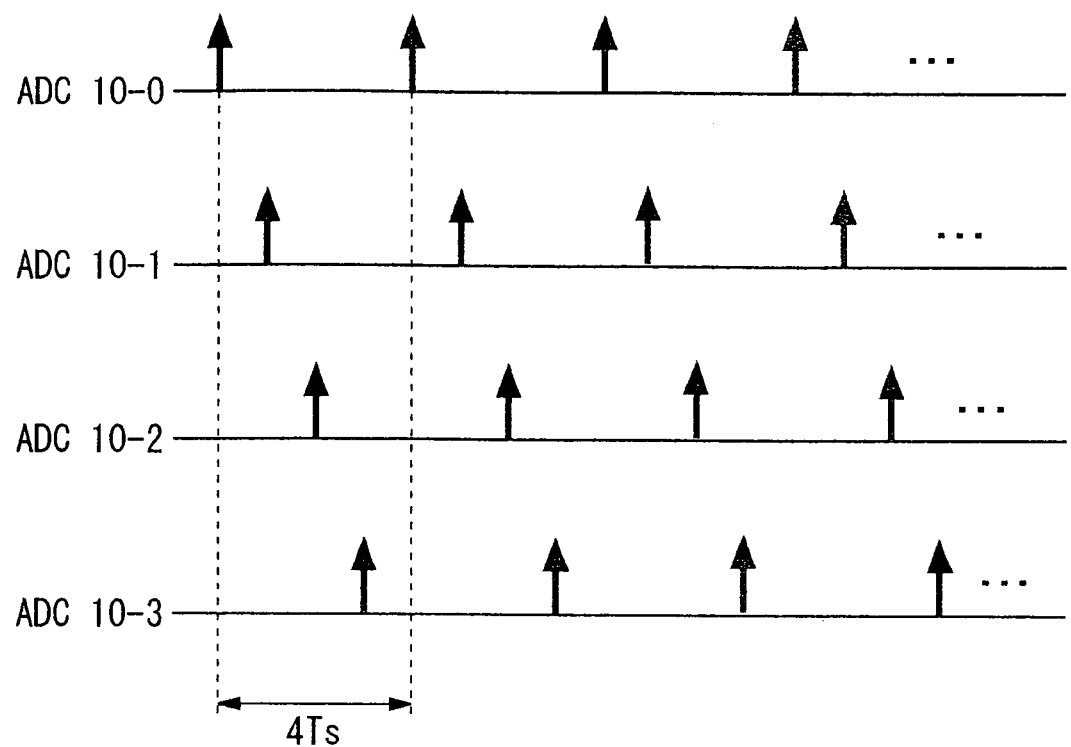
FIG. 2 is a view explaining a sampling clock being supplied to each of ADCs.

FIG. 2 is a view explaining a sampling clock being supplied to each of the ADCs 10. For example, when converting analog signals of $[-1/(2Ts), 1/(2Ts)]$ band into digital signals, sampling clocks having a frequency of $1/(4Ts)$ are supplied to each of the ADCs 10 in different timing by phase Ts. Since an analog signal is sampled using such a sampling clock, it is possible to sample the analog signal at a rate of four times of a sampling frequency of each of the ADCs 10.

Figure 3:
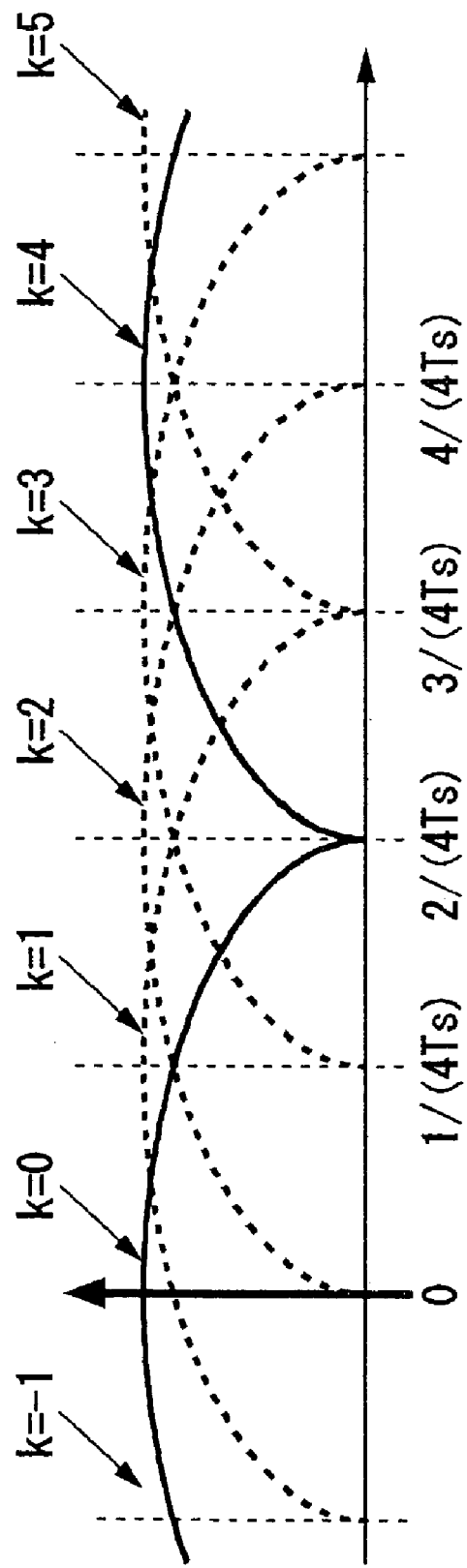
FIG. 3 is a view exemplary showing a frequency characteristic of a signal output from each of Fourier transform units.

FIG. 3 is a view exemplary showing a frequency characteristic of a signal output from each of Fourier transform units 12. Spurious components (k=−1, 1, 2, 3, 4, and 5) occur on the frequency domain signal that is made by sampling analog signals in $[-1/(2Ts), 1/(2Ts)]$ band with $1/(4Ts)$ frequency in addition to a signal component (k=0) as shown by a solid line in FIG. 3. All frequency characteristics have the signal component and the spurious components as shown in FIG. 3. However, since the sampling clocks of the ADCs 10 deviate from one another by Ts, the components of frequency characteristics have directions different from one another in a complex space.

Figure 4:
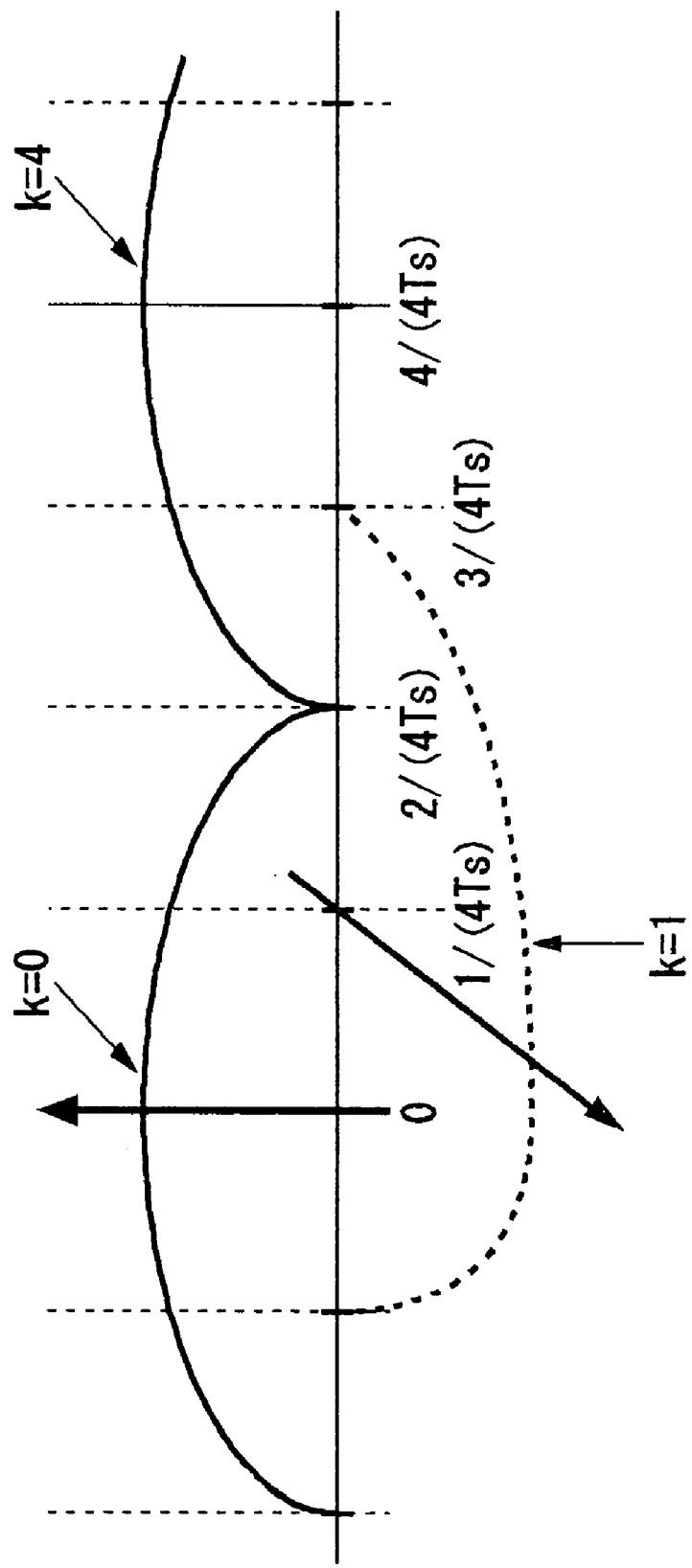
FIG. 4 is a view exemplary showing a part of a frequency characteristic of a signal output from a Fourier transform unit.

FIG. 4 is a view exemplary showing a part of a frequency characteristic of a signal output from the Fourier transform unit 12-1. Assuming that all components (k=−1 to 5) of the frequency characteristic of a signal output from the Fourier transform unit 12-0 have the same direction in a complex space as shown in FIG. 3, a signal component (k=0) of the frequency characteristic output from the Fourier transform unit 12-1 has the same direction as that of a signal component (see FIG. 3) of the frequency component output from the Fourier transform unit 12-0. However, since a phase of a sampling clock of the ADC 10-1 advances by Ts compared with a phase of a sampling clock of the ADC 10-0, a spurious component (k=1) of the frequency characteristic of the signal output from the Fourier transform unit 12-1 rotates by 90 degrees relative to a signal component (k=0). Similarly, the other spurious components (k=2, 3, 4, 5, not shown) sequentially rotate by 90 degrees.

Figure 5:
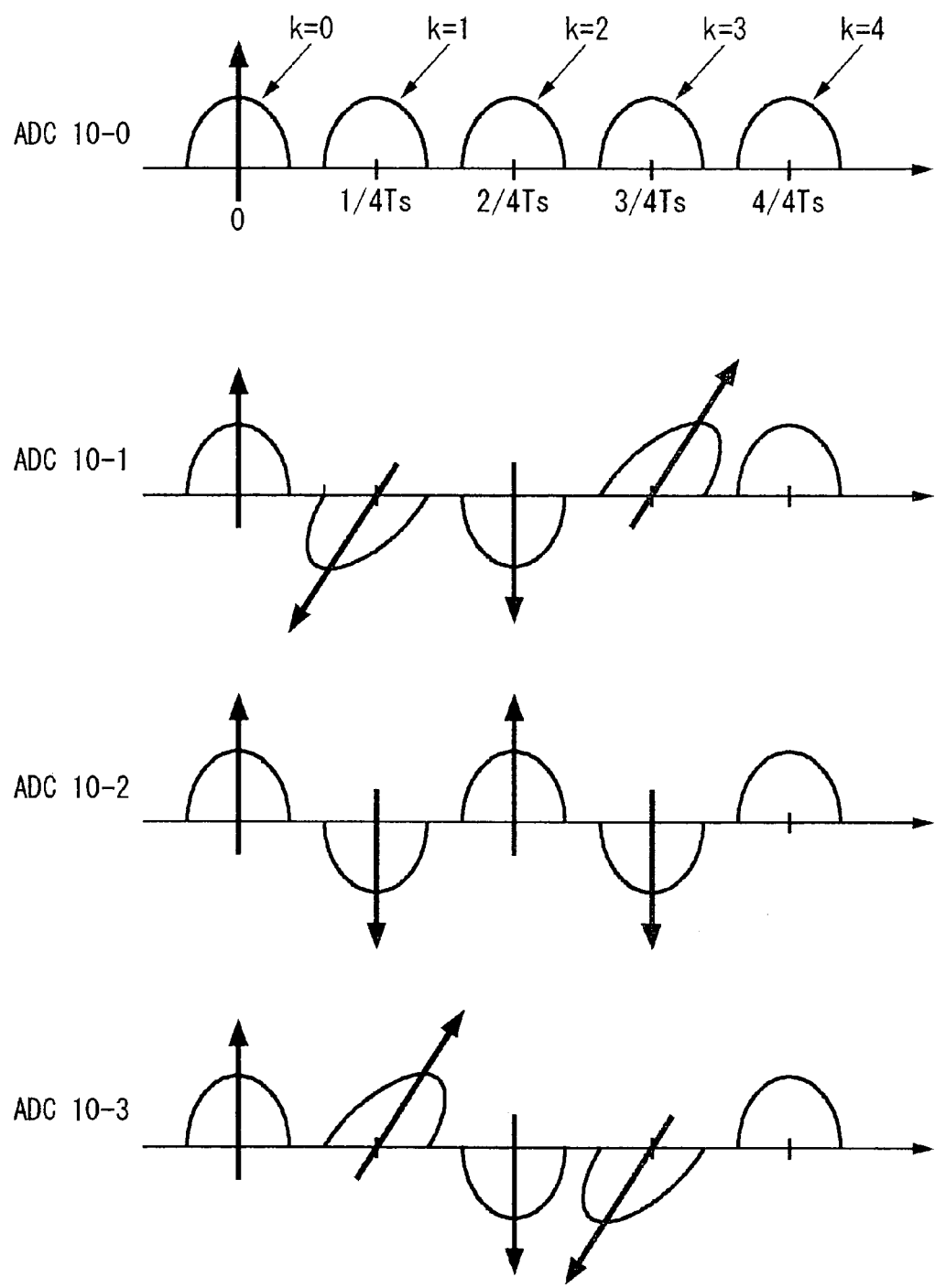
FIG. 5 is a view exemplary in which each of frequency characteristics is displayed on a complex space.

FIG. 5 is a view exemplary in which each of frequency characteristics is displayed on a complex space. Although a signal component and a spurious component are discretely shown in FIG. 5, a signal component and a spurious component may be overlapped like the frequency characteristic shown in FIG. 3.

As described above, a component of the frequency characteristic of the signal output from the Fourier transform unit 12-1 sequentially rotates by 90 degrees. Moreover, since a phase of a sampling clock of the ADC 10-2 advances by 2Ts compared with the phase of the sampling clock of the ADC 10-0, a component of the frequency characteristic of the signal output from the Fourier transform unit 12-2 rotates by 180 degrees as shown in FIG. 5. Similarly, since a phase of a sampling clock of the ADC 10-3 advances by 3Ts compared with the phase of the sampling clock of the ADC 10-0, a component of the frequency characteristic of the signal output from the Fourier transform unit 12-3 rotates by 270 degrees as shown in FIG. 5.

The spurious components (k=−1, 1, 2, 3, 5) of each frequency characteristic are removed by synthesizing these frequency characteristics, only signal component (k=0) and aliasing component (k=4) remain. However, when a variation occurs in sampling timing of the ADC 10 due to a phase error of each sampling clock and a frequency characteristic error of the ADC 10, it is not possible to remove a spurious component by causing a variation in an angle of the spurious component.

Figure 6:
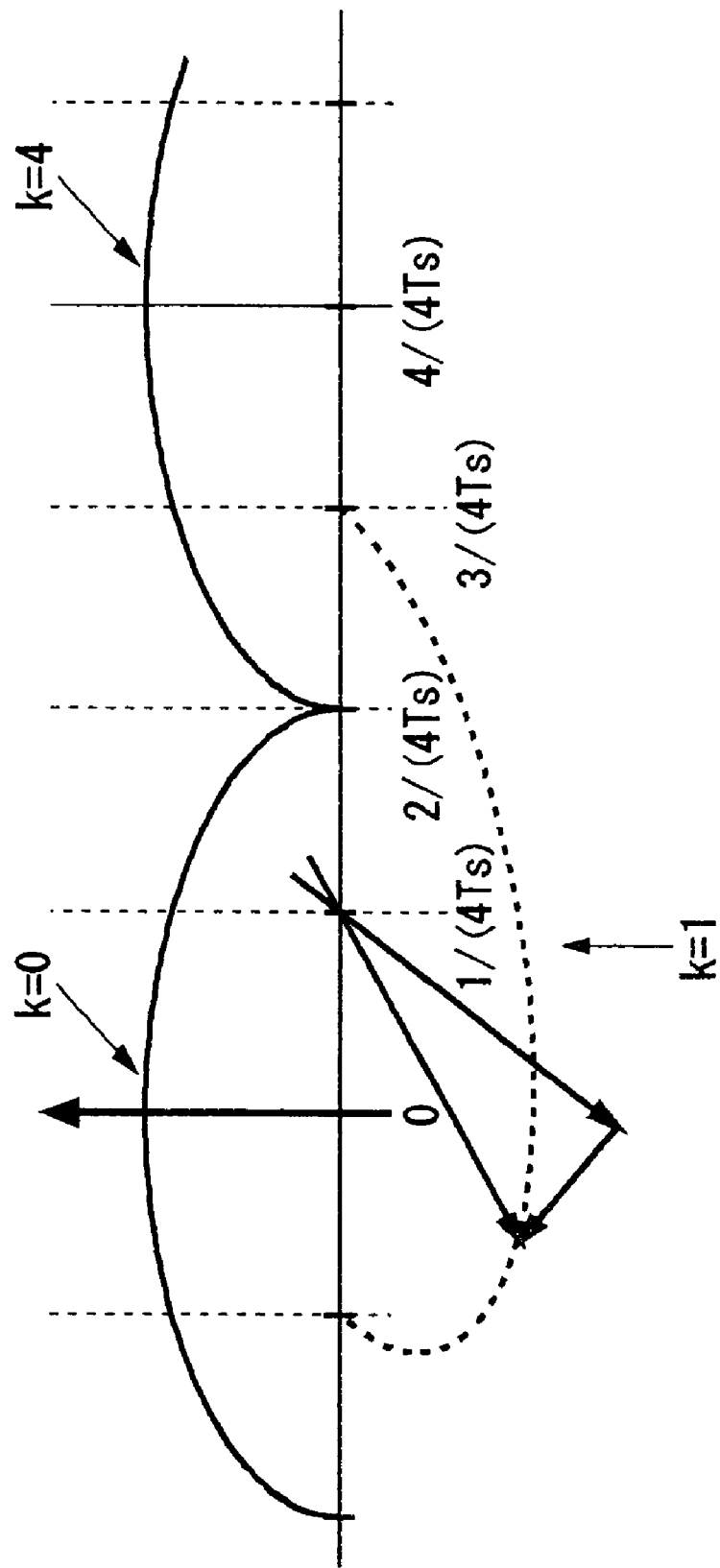
FIG. 6 is a view showing another example of a part of a frequency characteristic of a signal output from the Fourier transform unit.

FIG. 6 is a view showing another example of a part of a frequency characteristic of a signal output from the Fourier transform unit 12-1. As described above, when there is a phase error in the sampling clock supplied from the ADC 10-1 or the frequency characteristic of the ADC 10-1 is not ideal, as shown in FIG. 6, since a variation occurs in an angle of the spurious component (e.g., k=1) and thus the spurious component is not offset by a spurious component (k=1) of the other frequency characteristic, a spurious component remains when synthesizing all frequency characteristics.

The analog-to-digital conversion apparatus 100 explained in FIG. 1 corrects a variation of an angle of such a spurious component, which is caused by the frequency characteristic of the ADC 10 and the phase error of the sampling clock, to perform interleaving and thus removes a spurious component. An operation of the analog-to-digital conversion apparatus 100 will be described below.

Figure 7:
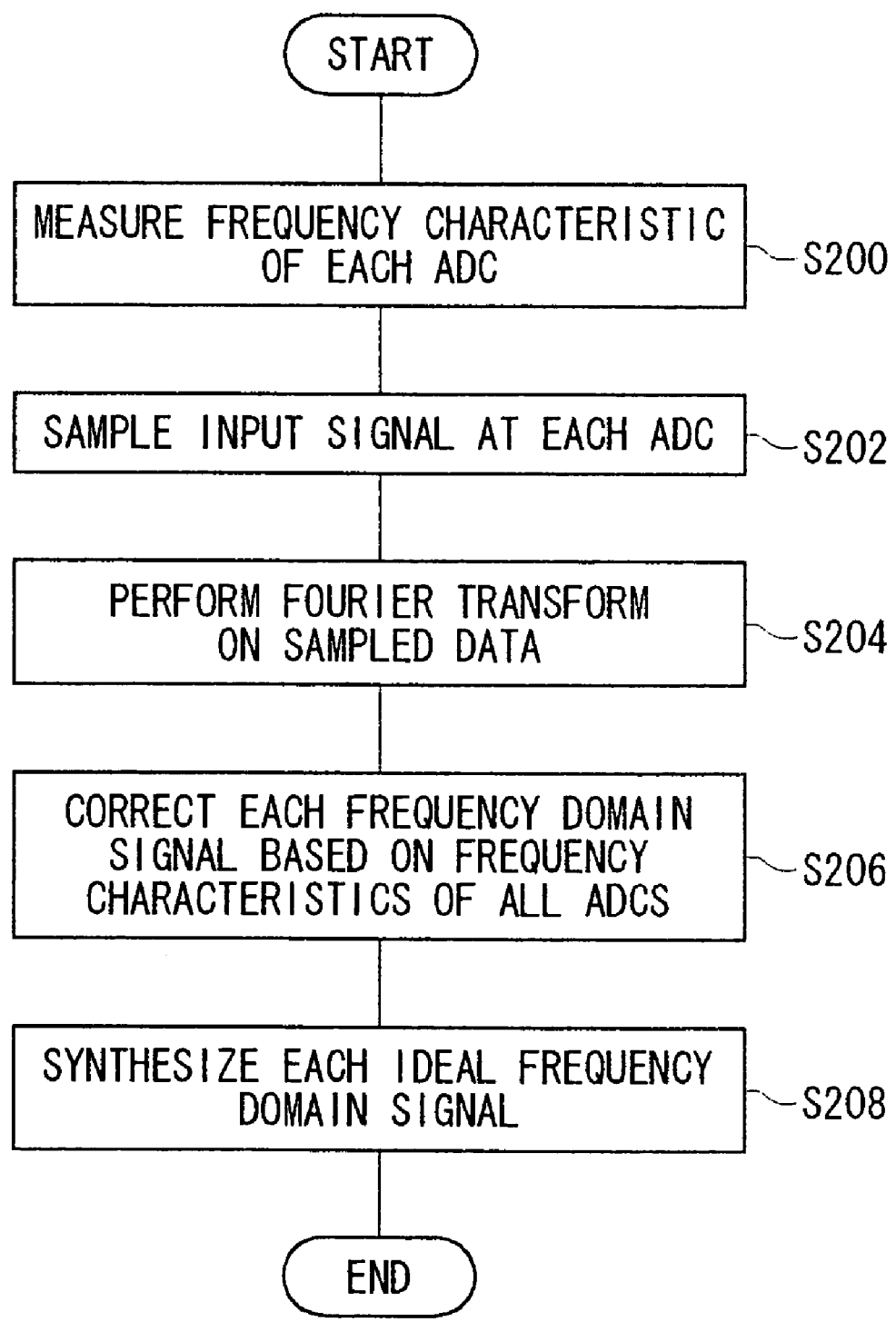
FIG. 7 is a flowchart exemplary showing an operation of an analog-to-digital conversion apparatus.

FIG. 7 is a flowchart exemplary showing an operation of an analog-to-digital conversion apparatus 100. At first, in measurement step S200, a measuring unit 10 previously measures a frequency characteristic of each ADC 10. Here, the frequency characteristic of each ADC 10 is given by the following expression.

$$a_l(k) = \frac{1}{4Ts} a\left(f - \frac{k}{4Ts}\right) e^{-j\pi kl/2}$$

Here, l shows the corresponding ADC 10, and l=0, 1, 2, and 3.

Next, in sampling step S202, an analog signal supplied as an input signal is sampled by means of the plurality of ADCs 10. At this time, sampling clocks $p_0(t)$, $p_1(t)$, $p_2(t)$ and $p_3(t)$ supplied to each of the ADCs 10 is given by the following expression.

$$p_0(t) = \sum_{n=-\infty}^{\infty} \delta(t - 4nTs)$$

$$p_1(t) = \sum_{n=-\infty}^{\infty} \delta(t - (4n+1)Ts)$$

$$p_2(t) = \sum_{n=-\infty}^{\infty} \delta(t - (4n+2)Ts)$$

$$p_3(t) = \sum_{n=-\infty}^{\infty} \delta(t - (4n+3)Ts)$$

Expression 1

Next, in Fourier transform step S204, the Fourier transform unit 12 respectively transforms the data sampled by the plurality of ADCs 10 by means of Fourier transform method, and generates a plurality of frequency domain signals corresponding to the plurality of ADCs 10. At this time, the Fourier transform of the sampling clock shown in Expression 1 is given by the following expression.

$$P_l(f) = e^{-j2\pi f(lTs)} \frac{1}{4Ts} \sum_{k=-\infty}^{\infty} \delta\left(f - \frac{k}{4Ts}\right)$$

Expression 2

The frequency domain signal $X_l(f)$ output from each Fourier transform unit 12 is given by the following expression by means of Expression 2.

$$X_l(f) = \frac{1}{4Ts} \sum_{k=-\infty}^{\infty} X\left(f - \frac{k}{4Ts}\right) e^{-j\pi kl/2}$$

Expression 3

Moreover, assuming that $$\bar{x}(k) = \frac{1}{4Ts} X\left(f - \frac{k}{4Ts}\right),$$

each frequency domain signal can be expressed as follows. Here, in this example, the frequency characteristic of the ADC 10-0 is explained as an ideal frequency characteristic. In other words, it is explained as $a_0(k)=1$.

$X_0(f) = \bar{x}(-1) + \bar{x}(0) + \bar{x}(1) + \bar{x}(2) + \bar{x}(3) + \bar{x}(4) + \bar{x}(5)$ $X_1(f) = a_1(-1)\bar{x}(-1) + a_1(0)\bar{x}(0) + a_1(1)\bar{x}(1) + a_1(2)\bar{x}(2) + a_1(3)\bar{x}(3) + a_1(4)\bar{x}(4) + a_1(5)\bar{x}(5)$ $X_2(f) = a_2(-1)\bar{x}(-1) + a_2(0)\bar{x}(0) + a_2(1)\bar{x}(1) + a_2(2)\bar{x}(2) + a_2(3)\bar{x}(3) + a_2(4)\bar{x}(4) + a_2(5)\bar{x}(5)$ $X_3(f) = a_3(-1)\bar{x}(-1) + a_3(0)\bar{x}(0) + a_3(1)\bar{x}(1) + a_3(2)\bar{x}(2) + a_3(3)\bar{x}(3) + a_3(4)\bar{x}(4) + a_3(5)\bar{x}(5)$ Expression 4

Here, fs is sampling frequency of each analog-digital converter, items from k=−1 to 5 show components included in a band [0, 4 fs] assuming that a band of X(f) is [−2 fs, 2 fs], and $a_j(k)$ shows a component corresponding to $\bar{x}(k)$ among frequency characteristics of the j-th analog-digital converter.

Next, in correction step S206, the frequency domain signals are multiplied by correction coefficients based on the frequency characteristics of all ADCs 10 using the correction unit 16 in order to be converted into frequency domain signals obtained when the frequency characteristics of the corresponding ADCs 10 is ideal. In this example, in the correction unit 16, the spurious components of k=−1, 1, 2, 3, 5 are removed and a correction coefficient in which only the signal component of k=0 and the aliasing component of that signal component remain is multiplied by each of the frequency characteristics when computing linear sum of frequency components $X_0(f)$ to $X_3(f)$ shown in Expression 4. In other words, the correction coefficients $L_1$, $L_2$, $L_3$ such as Expression 5 are computed, and the correction coefficients are multiplication by each frequency characteristic. Here, α, β are arbitrary real number.

$X_0(f) + L_1 X_1(f) + L_2 X_2(f) + L_3 X_3(f) = \alpha \bar{x}(0) + \beta \bar{x}(4)$ Expression 5

At this time, the correction unit 16 divides the frequency band [−2 fs, 2 fs] of the digital signal to be computed according to the number of ADCs 10. In this example, the correction unit 16 divides the frequency band of the digital signal to be computed into a first region of band [0, fs], a second region of band [fs, 2 fs], a third region of band [2 fs, 3 fs], and a fourth region of band [3 fs, 4 fs].

As we know from Expression 4, although the spurious components included in the frequency band [−2 fs, 2 fs] of the digital signal are four, e.g., k=−1, 1, 2, 3, as clear from Expression 5, there are not correction coefficients $L_1$, $L_2$, $L_3$ to erase four spurious components in the same time. However, each divided region when dividing a frequency band of digital signal like this example has three spurious components as shown in FIG. 3. For this reason, the correction unit 16 can compute each correction coefficient for each frequency band as shown in the following expression.

The first region $$\begin{pmatrix} L_1 \\ L_2 \\ L_3 \end{pmatrix} = \begin{pmatrix} a_1(-1) & a_2(-1) & a_3(-1) \\ a_1(1) & a_2(1) & a_3(1) \\ a_1(2) & a_2(2) & a_3(2) \end{pmatrix}^{-1} \begin{pmatrix} -1 \\ -1 \\ -1 \end{pmatrix} \quad \text{Expression 6}$$

The second region and the third region $$\begin{pmatrix} L_1 \\ L_2 \\ L_3 \end{pmatrix} = \begin{pmatrix} a_1(1) & a_2(1) & a_3(1) \\ a_1(2) & a_2(2) & a_3(2) \\ a_1(3) & a_2(3) & a_3(3) \end{pmatrix}^{-1} \begin{pmatrix} -1 \\ -1 \\ -1 \end{pmatrix} \quad \text{Expression 7}$$

The fourth region $$\begin{pmatrix} L_1 \\ L_2 \\ L_3 \end{pmatrix} = \begin{pmatrix} a_1(2) & a_2(2) & a_3(2) \\ a_1(3) & a_2(3) & a_3(3) \\ a_1(5) & a_2(5) & a_3(5) \end{pmatrix}^{-1} \begin{pmatrix} -1 \\ -1 \\ -1 \end{pmatrix} \quad \text{Expression 8}$$

Then, in synthesizing step S208, the interleaving unit 18 synthesizes each of the frequency domain signals obtained in correction step S206 to generate a frequency spectrum of the digital signal. At this time, since the computed correction coefficients $L_1$, $L_2$, $L_3$ are multiplied by each frequency domain signal in correction step S206, the phases of signal component (k=0) and aliasing component (k=4) are changed. For this reason, in correction step S206, a correction coefficient correcting the change is further computed.

The correction step S206 in this example has a first computation step computing the first correction coefficient and a second computation step computing the second correction coefficient. In the first computation step, each of the first correction coefficients $L_1$, $L_2$, $L_3$ multiplied by each of the frequency domain signals is computed based on the frequency characteristics of all ADCs 10 so that a spurious component of each of the frequency domain signals caused by the frequency characteristic of each of the ADCs 10 is offset. Moreover, in the first computation step, the first correction coefficients $L_1$, $L_2$, $L_3$ offsetting a spurious component existing in each region, which is made by dividing the previously described frequency band, among the spurious components of each frequency signal are computed for each divided region.

Moreover, in the second computation step, the second correction coefficients for correcting a phase error of a signal component and an aliasing component of frequency domain signal caused by multiplying the first correction coefficients are computed for each divided region based on each of the first correction coefficients and each of the frequency characteristics. Since only signal component (k=0) remains in the first region and the second region, in the first region and the second region $1/(1+a_1(0)L_1+a_2(0)L_2+a_3(0)L_3)$ is computed as the second correction coefficient. Moreover, since only aliasing component (k=4) remains in the third region and the fourth region, $1/(1+a_1(4)L_1+a_2(4)L_2+a_3(4)L_3)$ is computed as the second correction coefficient.

Then, in synthesizing step S208, the result that is made by synthesizing each of the frequency domain signals obtained in correction step S206 is multiplied by the previously described second correction coefficient. Moreover, in this example, although the second correction coefficient is multiplied in synthesizing step S208, in another example, the second correction coefficient may be multiplied in correction step S206. In other words, in correction step S206, the corresponding first correction coefficient and the corresponding second correction coefficient are multiplied by each frequency domain signal.

As described above, in synthesizing step S208, a frequency spectrum of digital signal is computed for each region based on the following expression.

The first region and the second region $$X'(f) = \frac{1}{1+a_1(0)L_1+a_2(0)L_2+a_3(0)L_3}\{X_0(f)+L_1X_1(f)+L_2X_2(f)+L_3X_3(f)\} \quad \text{Expression 9}$$

The third region and the fourth region $$X'(f) = \frac{1}{1+a_1(4)L_1+a_2(4)L_2+a_3(4)L_3}\{X_0(f)+L_1X_1(f)+L_2X_2(f)+L_3X_3(f)\} \quad \text{Expression 10}$$

In other words, in synthesizing step S208, a frequency spectrum in the first region is computed by using the correction coefficients $L_1$, $L_2$, $L_3$ computed by Expression 6 in Expression 9. Moreover, a frequency spectrum in the second region is computed by using the correction coefficients $L_1$, $L_2$, $L_3$ computed by Expression 7 in Expression 9, a frequency spectrum in the third region is computed by using the correction coefficients $L_1$, $L_2$, $L_3$ computed by Expression 7 in Expression 10, and a frequency spectrum in the fourth region is computed by using the correction coefficients $L_1$, $L_2$, $L_3$ computed by Expression 8 in Expression 10. By such an operation, it is possible to obtain a frequency spectrum in which a spurious component is removed.

Moreover, in this example, the frequency characteristic of ADC 10-0 is explained as ideal frequency characteristic. However, although the frequency characteristic of ADC 10-0 is not ideal but has a certain frequency characteristic, it is possible to remove a spurious component by correcting the signals based on this frequency characteristic.

In this case, assuming that the result obtained by dividing the frequency characteristic of other ADC 10 by the frequency characteristic of ADC 10-0 is the frequency characteristic $a_1(k)$ of the other ADC 10, it is possible to correct the signal. In other words, assuming that the previously measured frequency characteristics of ADC 10-1 (l=0, 1, 2, 3)

are respectively Fad(1), each frequency characteristic $a_1(k)$ used to correct the signal is expressed by the following expressions.

$a_0(k)$=Fad(0)

$a_1(k)$=Fad(1)/Fad(0)

$a_2(k)$=Fad(2)/Fad(0)

$a_3(k)$=Fad(3)/Fad(0)  Expression 11

Moreover, using the frequency characteristics shown in Expression 11, Expression 9 and Expression 10 are expressed by the following expressions.

$$X'(f) = \frac{1}{a_0(0)} \cdot \frac{1}{1+a_1(0)L_1 + a_2(0)L_2 + a_3(0)L_3} \{X_0(f) + L_1 X_1(f) + L_2 X_2(f) + L_3 X_3(f)\}$$  Expression 9

$$X'(f) = \frac{1}{a_0(4)} \cdot \frac{1}{1+a_1(4)L_1 + a_2(4)L_2 + a_3(4)L_3} \{X_0(f) + L_1 X_1(f) + L_2 X_2(f) + L_3 X_3(f)\}$$  Expression 10

Hereinbefore, a given analog signal has been explained as a complex signal. However, when a given analog signal is a real signal, only an operation corresponding to the first region and the second region is applied among the correction methods. For example, in synthesizing step S208, the frequency spectrums in the first region and the second region are computed by using the correction coefficient computed by Expression 6 or Expression 7 in Expression 9, and the complex conjugate of the frequency spectrums in the first region and the second region is computed as the frequency spectrums in the third region and the fourth region.

Moreover, although a band of the computed frequency spectrum has been explained as [0, 4 fs] in this example, it is possible to realize a similar operation even in case of using the band as [−2 fs, 2 fs]. For example, it is possible to remove a spurious component in a similar operation by regarding the band of the third region as [−fs, 0] and the band of the fourth region as [−2 fs, −fs].

Moreover, each frequency characteristic may be computed as follows on the basis of the frequency characteristic a(0) of k=0.

a(−1): shift a(0) by −fs/4 a(1): shift a(0) by fs/4 a(2): shift a(0) by 2 fs/4 a(3): shift a(0) by 3 fs/4 a(5): shift a(0) by 5 fs/4

Moreover, when the Fourier transform unit 12 performs Fourier transform by means of discrete Fourier transform, the discrete Fourier transform of each output signal of ADCs 10 is given by the following expression.

$$DFT_0(k) = \sum_{n=0}^{(N/4)-1} x(4nTs)e^{-j2\pi kn/\frac{N}{4}}$$

$$DFT_1(k) = \sum_{n=0}^{(N/4)-1} x((4n+1)Ts)e^{-j2\pi kn/\frac{N}{4}}$$

$$DFT_2(k) = \sum_{n=0}^{(N/4)-1} x((4n+1)Ts)e^{-j2\pi kn/\frac{N}{4}}$$

$$DFT_3(k) = \sum_{n=0}^{(N/4)-1} x((4n+1)Ts)e^{-j2\pi kn/\frac{N}{4}}$$

Expression 12

Then, the frequency domain signal transformed by the discrete Fourier transform method is given by the following expression.

$$X_l\left(\frac{k}{NTs}\right) = \sum_{n=0}^{(N/4)-1} x((4n+l)Ts)e^{-j2\pi f((4n+l)Ts)}$$

$$= e^{-j2\pi kl/N} \sum_{n=0}^{(N/4)-1} x((4n+l)Ts)e^{-j2\pi kn/\frac{N}{4}}$$

$$= e^{-j2\pi kl/N} DFT_l(k)$$

For this reason, Expression 9 and Expression 10 are expressed as follows.

$$X'\left(\frac{k}{NTs}\right) = \frac{1}{1+a_1(0)L_1 + a_2(0)L_2 + a_3(0)L_3}(DFT_0(k) + L_1 \cdot e^{-j2\pi k \cdot 1/N} \cdot DFT_1(k) + L_2 \cdot e^{-j2\pi k \cdot 2/N} \cdot DFT_2(k) + L_3 \cdot e^{-j2\pi k \cdot 3/N} DFT_3(k))$$

Expression 9'

$$X'\left(\frac{k}{NTs}\right) = \frac{1}{1+a_1(4)L_1 + a_2(4)L_2 + a_3(4)L_3}(DFT_0(k) + L_1 \cdot e^{-j2\pi k \cdot 1/N} \cdot DFT_1(k) + L_2 \cdot e^{-j2\pi k \cdot 2/N} \cdot DFT_2(k) + L_3 \cdot e^{-j2\pi k \cdot 3/N} DFT_3(k))$$

Expression 10'

Moreover, it has been explained that the number of ADCs 10 is four. However, although the number of ADCs 10 is N (N is two or more integer number), it is possible to compute the frequency spectrum in which a spurious component is removed. For example, Expression 4, Expression 5, Expression 9, and Expression 10 are expressed by the following expressions.

$X_0(f)=\bar{x}(-l)+\bar{x}(-l+1)+\Lambda+\bar{x}(m-1)+\bar{x}(m)$ $X_1(f)=a_1(-l)\bar{x}(-l)+a_1(-l+1)\bar{x}(-l+1)+\Lambda+a_1(m-1)\bar{x}(m)$ $X_{N-1}^M(f)=a_{N-1}(-l)\bar{x}(-l)+a_{N-1}(-l+1)\bar{x}(-l+1)+\Lambda+a_{N-1}(m-1)\bar{x}(m)$  Expression 4'

(Here, in the above expression, assuming that the band of X(f) is [−Nfs/2, Nfs/2] (fs is sampling frequency of each analog-digital converter), terms from −1 to m are components included in the band [0, Nfs], and $a_j(k)$ shows a component corresponding to $\bar{x}(k)$ among the frequency characteristics of the j-th analog-digital converter).

$$X_0(f)+L_1X_1(f)+L_2X_2(f)+\Lambda+L_{N-1}X_{N-1}(f)=\alpha\bar{x}(0)+\beta\bar{x}(u) \quad \text{Expression 5'}$$

(Here, in the above expression, $\alpha$ and $\beta$ are arbitrary real number, and $x(u)$ is an aliasing component of $x(0)$.

$$X'(f) = \frac{1}{1 + a_1(0)L_1 + a_2(0)L_2 + \Lambda + a_{N-1}(0)L_{N-1}} \{X_0(f) + L_1X_1(f) + L_2X_2(f) + \Lambda + L_{N-1}X_{N-1}(f)\} \quad \text{Expression 9''}$$

$$X'(f) = \frac{1}{1 + a_1(u)L_1 + a_2(u)L_2 + \Lambda + a_{N-1}(u)L_{N-1}} \{X_0(f) + L_1X_1(f) + L_2X_2(f) + \Lambda + L_{N-1}X_{N-1}(f)\} \quad \text{Expression 10''}$$

Figure 8:
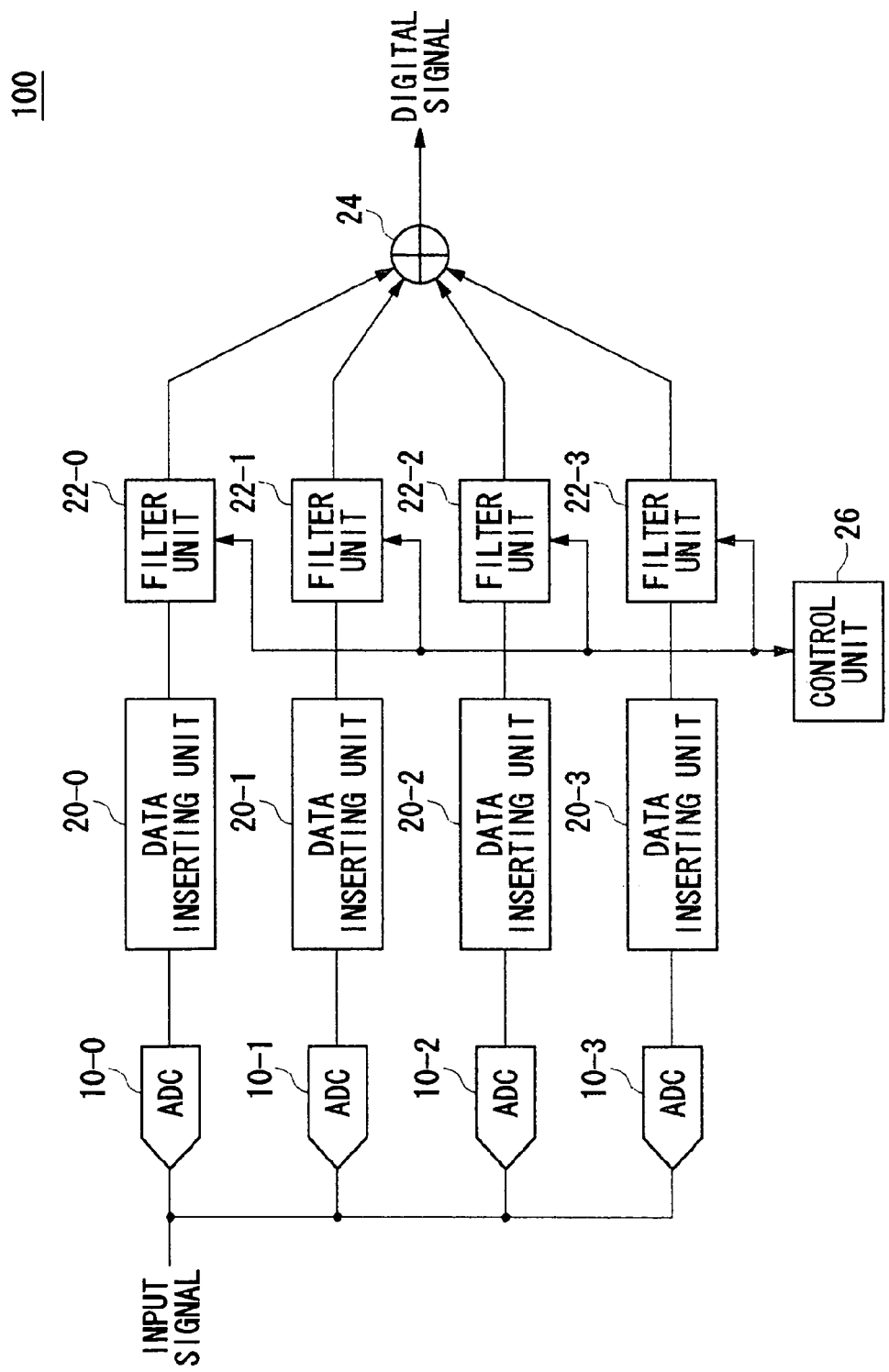
FIG. 8 is a view exemplary showing a configuration of the analog-to-digital conversion apparatus according to an embodiment of the present invention.

FIG. 8 is a view exemplary showing a configuration of the analog-to-digital conversion apparatus 100 according to an embodiment of the present invention. Although the analog-to-digital conversion apparatus 100 as described using FIGS. 1 to 7 converts the sampled digital data into the signal in the frequency domain to correct the signal, the analog-to-digital conversion apparatus 100 in this example corrects the digital signal in time domain in the same way as a correction in that frequency domain.

That is, when generating the digital signal using four ADCs 10 and transforming the digital data output from each of the ADCs 10 into the signal in the frequency domain by the discrete Fourier transform, the correction of the frequency domain described using FIGS. 1 to 7 is performed on the discrete Fourier transform $DFT_1(k)$ of the signal output from each of the ADCs 10 according to Expression 9' and Expression 10'. On the other hand, the analog-to-digital conversion apparatus 100 in this example corrects digital data of time axis output from each of the ADCs 10 in the substantially same way as the correction by Expression 9' and Expression 10' when generating digital signal using four ADCs 10. Moreover, when generating digital signal using N ADCs 10, a correction is performed in the substantially same way as the correction by Expression 9'' and Expression 10''.

The analog-to-digital conversion apparatus 100 in this example includes a plurality of ADCs 10, a plurality of data inserting units 20-0 to 20-3 (hereinafter referred to as 20), a plurality of filter units 22-0 to 22-3 (hereinafter referred to as 22), a control unit 26, and a synthesizing unit 24. In this example, the analog-to-digital conversion apparatus 100 including four ADCs 10 will be explained. However, although the analog-to-digital conversion apparatus 100 uses N ADCs 10, it is possible to perform a similar correction.

Moreover, the analog-to-digital conversion apparatus 100 may receive digital data output from outside ADCs 10 without including the ADCs 10. In this case, the analog-to-digital conversion apparatus 100 may use, e.g., a FPGA (Field Programmable Gate Array).

The plurality of ADCs 10, which has the same function as that of the ADCs 10 explained in FIGS. 1 to 7, respectively receives input signals (analog signals) that diverge from a main line and converts the analog signals into digital data in different timing by a predetermined phase.

Figure 9:
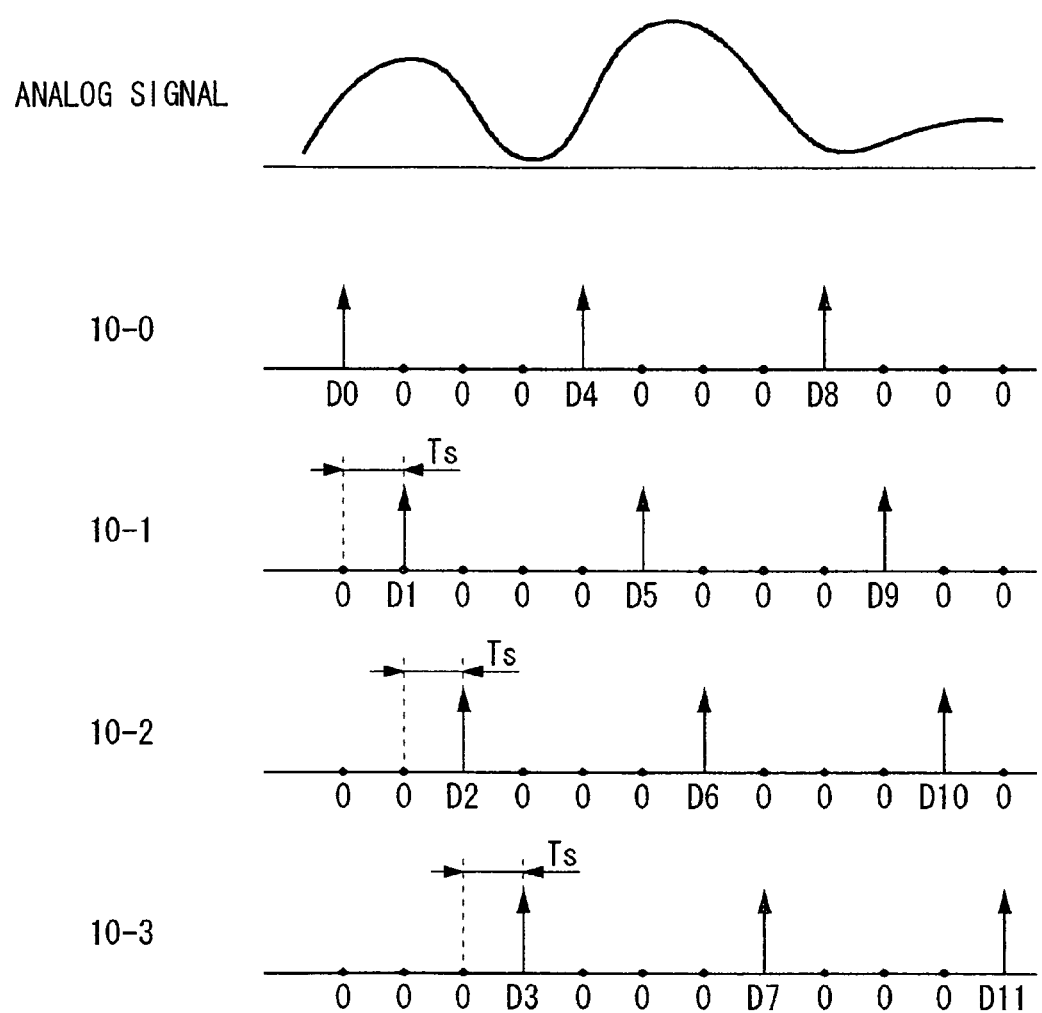
FIG. 9 is a view explaining an operation of a data inserting unit.

The plurality of data inserting units 20 is provided corresponding to the plurality of ADCs 10, and generates zero-inserted data that is made by respectively inserting data with data value zero between the digital data output from the respectively corresponding ADCs 10 by a predetermined number. For example, each of the data inserting units 20 inserts data with data value zero between the digital data by N−1 (N is the number of ADCs 10) as shown in FIG. 9. It is preferable that the data inserting unit 20 inserts data with data value zero so that data intervals between the digital data after inserting them are generally equal.

The term of $e^{-j2\pi k \cdot l/N}$ (l=1, 2, 3) in Expression 9 and Expression 10' means that a phase of a sampling clock in each ADC 10 is different from one another by 1/(4Ts). On the other hand, the data inserting unit 20 performs the data insertion for the digital data output from each of the ADCs 10 to generate digital data having a phase different from one another by 1/(4Ts) in a time axis. That is to say, the data inserting unit 20 performs a process equal to the process in which a signal on the frequency axis is multiplied by $e^{-j2\pi k \cdot l/N}$ with respect to digital data on a time axis in Expression 9' and Expression 10'.

The synthesizing unit 24 respectively receives zero-inserted data via the filter units 22, and synthesizes the received zero-inserted data to generate a digital signal. Here, the synthesizing means that digital data having the same phase are added for each zero-inserted data.

The plurality of filter units 22 is provided corresponding to the plurality of ADCs 10, and has filter coefficient based on frequency characteristic of each of the ADCs 10 and passes through the corresponding zero-inserted data to supply the data to the synthesizing unit 24 so that the digital signal generated from the synthesizing unit 24 is a digital signal obtained when the frequency characteristics of the plurality of ADCs 10 are identical.

Specifically, each of the filter units 22 has the following filter coefficient.

$$DF_0(k) = IFFT \left\{ \begin{array}{l} \dfrac{1}{1 + a_1(0) \cdot L_1 + a_2(0) \cdot L_2 + a_3(0) \cdot L_3} \quad [0, 2fs] \\ \dfrac{1}{1 + a_1(4) \cdot L_1 + a_2(4) \cdot L_2 + a_3(4) \cdot L_3} \quad [2fs, 4fs] \end{array} \right\} \quad \text{Expression 13}$$

$$DF_1(k) = IFFT \left\{ \begin{array}{l} \dfrac{L_1}{1 + a_1(0) \cdot L_1 + a_2(0) \cdot L_2 + a_3(0) \cdot L_3} \quad [0, 2fs] \\ \dfrac{L_1}{1 + a_1(4) \cdot L_1 + a_2(4) \cdot L_2 + a_3(4) \cdot L_3} \quad [2fs, 4fs] \end{array} \right\}$$

$$DF_2(k) = IFFT \left\{ \begin{array}{l} \dfrac{L_2}{1 + a_1(0) \cdot L_1 + a_2(0) \cdot L_2 + a_3(0) \cdot L_3} \quad [0, 2fs] \\ \dfrac{L_2}{1 + a_1(4) \cdot L_1 + a_2(4) \cdot L_2 + a_3(4) \cdot L_3} \quad [2fs, 4fs] \end{array} \right\}$$

-continued $$DF_3(k) = IFFT \left\{ \begin{array}{ll} \dfrac{L_3}{1 + a_1(0) \cdot L_1 + a_2(0) \cdot} & [0, 2fs] \\ L_2 + a_3(0) \cdot L_3 & \\ \dfrac{L_3}{1 + a_1(4) \cdot L_1 + a_2(4) \cdot} & [2fs, 4fs] \\ L_2 + a_3(4) \cdot L_3 & \end{array} \right\}$$

In Expression 13, IFF T shows an operator to process a function in a parenthesis in a Fourier inverse transform method.

Each filter unit 22 performs convolution calculation of the digital data output from the corresponding data inserting unit 20 and the filter coefficients shown in Expression 13. Moreover, in case of Expression 13, although the first region and the second region [0, 2 fs] use Expression 9' and the third region and the fourth region [2 fs, 4 fs] use Expression 10', in another example, all regions may use Expression 9'.

For example, the first region and the second region have a spectrum shown in Expression 9' and the third region and the fourth region have a complex conjugate spectrum of the spectrum of the first region and the second region. The filter coefficient may be computed by processing these spectra in a Fourier inverse transform method.

Since the digital data are passed through the filter units 22 having such filter coefficients, the digital signal output from the synthesizing unit 24 is corrected on a time axis substantially similarly to a frequency axis shown in Expression 9' and Expression 10'.

In other words, when respectively converting zero-inserted data into the signals in the frequency domain and synthesizing the signals, each filter unit 22 has the filter coefficient that is obtained by processing a multiplied result in a Fourier inverse transform method. Here, the multiplied result is obtained by multiplying the first correction coefficient $(1, L_1, L_2, L_3)$ to offset a spurious component caused by the frequency characteristics of the plurality of ADCs 10 by the second correction coefficient $(L_N/\Sigma a_N(0) \times L_N$, here N=0, 1, 2, 3, $L_0$=1, and $a_0(0)$=1) to correct a phase error caused by multiplication of the first correction coefficient. The first correction coefficient is a coefficient that is defined for each division band made by dividing a frequency band of digital signal as shown in Expressions 6 to 8. Moreover, the second correction coefficient is also a coefficient that is defined for each division band as shown in Expressions 9 and 10. In this way, it is possible to generate a digital signal in which a spurious component caused by an error of the frequency characteristics of the ADCs 10 is removed.

Moreover, the control unit 26 controls the filter coefficient of each filter unit 22. The control unit 26 may previously measure the frequency characteristic of each of the ADCs 10 similarly to the measuring unit 14 explained related to FIG. 1. The control unit 26 sets the filter coefficient of each filter unit 22, e.g., using Expression 13 based on the measured frequency characteristic of each of the ADCs 10.

FIG. 9 is a view explaining an operation of the data inserting unit 20. As described above, the data inserting units 20 respectively insert data with data value zero between the digital data output from the respectively corresponding ADCs 10 by a predetermined number. For example, although the ADC 10-0 outputs {D0, D4, D8, . . . } and digital data, the data inserting unit 20-0 may insert data with data value zero in the digital data by three. In this way, the data stream output form the data inserting unit 20-0 is {D0, 0, 0, 0, D4, 0, 0, 0, D8, 0, 0, 0, . . . }.

Moreover, the phase of the digital data output from each ADC 10 is different from one another by Ts as shown in FIG. 9. It is preferable that the data inserting units 20 respectively insert data with data value zero between the digital data every a predetermined phase Ts.

Figure 10:
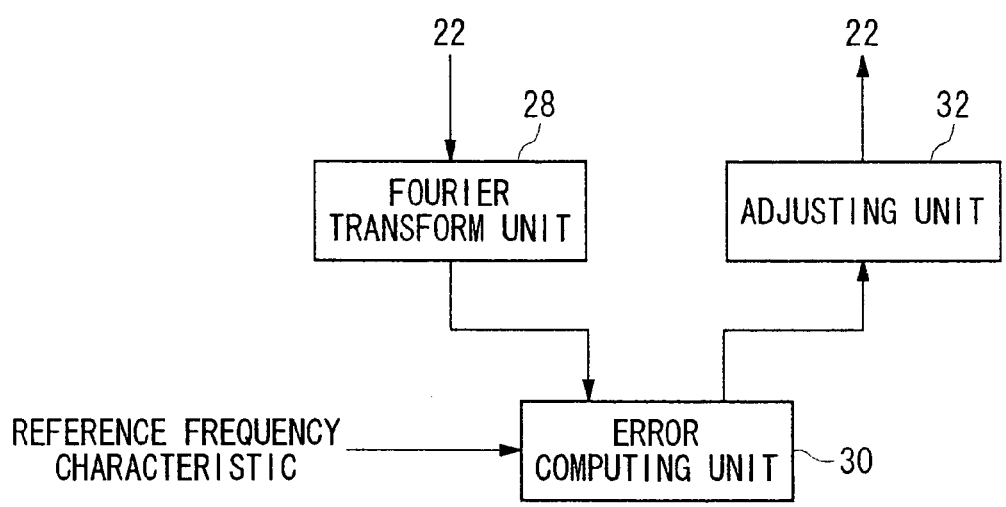
FIG. 10 is a view exemplary showing a configuration of a control unit.

FIG. 10 is a view exemplary showing a configuration of the control unit 26. In this example, each filter unit 22 stores the result obtained by multiplying a predetermined window function by the coefficient described related to Expression 13 as a filter coefficient. The window function may be, e.g., a rectangular window, a humming window, a Hanning window, and a Kaiser window.

The control unit 26 compares a frequency characteristic of the filter unit 22 with a predetermined reference frequency characteristic, and adjusts a shape and a width on a time axis of the window function so that an error between the frequency characteristic of the filter unit 22 and the reference frequency characteristic is within a predetermined range. The reference frequency characteristic may be a characteristic that is obtained by converting, e.g., the filter coefficient acquired by Expression 13 to a frequency domain.

The control unit 26 includes a Fourier transform unit 28, an error computing unit 30, and an adjusting unit 32. A reference frequency characteristic of each filter unit 22 is previously provided to the error computing unit 30. An operation of each unit will be explained by means of FIG. 11.

Figure 11:
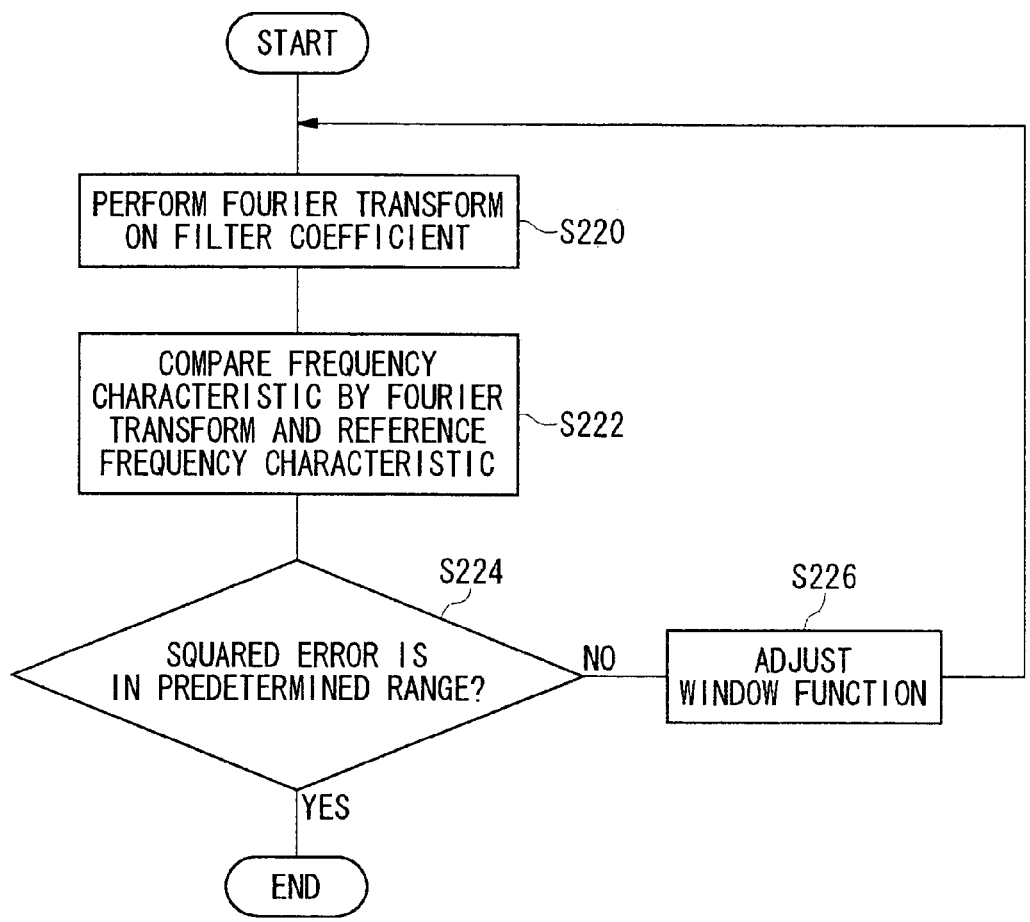
FIG. 11 is a flowchart exemplary showing an operation of the control unit.

FIG. 11 is a flowchart exemplary showing an operation of the control unit 26. At first, the Fourier transform unit 28 acquires the filter coefficient of each filter unit 22, and processes each filter coefficient in a Fourier transform method (S220). Next, the error computing unit 30 compares the frequency characteristic of each filter unit 22 computed by the Fourier transform unit 28 with the reference frequency characteristic, and computes a squared error. The reference frequency characteristic may be supplied for each filter unit 22. Moreover, the filter coefficient obtained by Expression 13 may be supplied to each filter unit 22 as each reference frequency characteristic. In this case, the error computing unit 30 processes the filter coefficient in a Fourier transform method, and computes each reference frequency characteristic.

Next, the error computing unit 30 decides whether a squared error between the frequency characteristic of each filter unit 22 and a squared frequency characteristic is within a predetermined range (S224). When the squared error computed by the error computing unit 30 is not within the predetermined range, the adjusting unit 32 adjusts a window function in the filter unit 22 corresponding to the squared error (S226). The adjusting unit 32 may adjust a width in a frequency axis of the window function, or may adjust a shape of the window function.

When adjusting a width in a frequency axis of the window function, the adjusting unit 32 may adjust the number of taps of the window function. For example, the adjusting unit 32 may increase the number of taps of the window function by a predetermined number.

Moreover, when adjusting a shape of the window function, the adjusting unit 32 may change a kind of the window function. For example, the adjusting unit 32 may sequentially change a kind of the window function in a known window function such as a humming window, a Hanning window, a Blackman window, and a Gauss window. Moreover, when using a Kaiser window function in the filter unit 22, the adjusting unit 32 may adjust a shape of the window function by changing a damping coefficient a of the Kaiser window by a predetermined number.

After the adjusting unit 32 adjusts the window function, the processes from S220 to S224 are repeated by means of the window function. Then, when the squared errors for the frequency characteristics of all the filter units 22 are within a predetermined range in S224, the processes are finished. Moreover, when the processes from S220 to S224 are repeated by a predetermined number of times, the processes may be finished.

By such a control, it is possible to use the most suitable window function in the filter unit 22.

Figure 12:
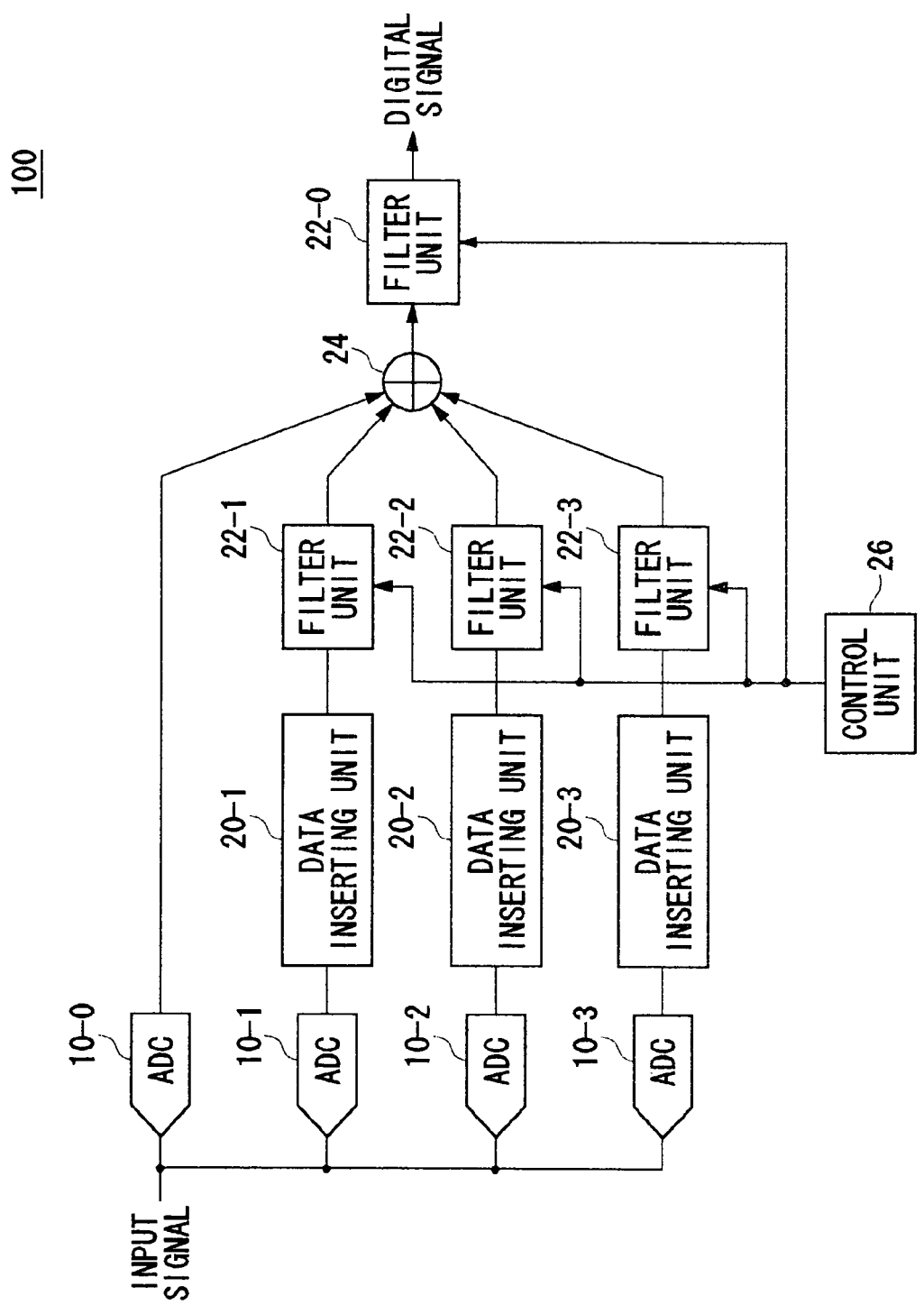
FIG. 12 is a view showing another example of a configuration of the analog-to-digital conversion apparatus.

FIG. 12 is a view showing another example of a configuration of the analog-to-digital conversion apparatus 100. In contrast with a configuration of the analog-to-digital conversion apparatus 100 explained in FIG. 8, the analog-to-digital conversion apparatus 100 in this example does not have the data inserting unit 20 corresponding to the predetermined reference ADC 10. In this example, the analog-to-digital conversion apparatus 100 does not have the data inserting unit 20-0 corresponding to the ADC 10-0.

Moreover, the analog-to-digital conversion apparatus 100 in this example provides the filter unit 22-0 corresponding to the reference ADC 10 behind the synthesizing unit 24. The other configurations are the same as those of the analog-to-digital conversion apparatus 100 explained in FIG. 8.

The functions of the plurality of ADCs 10 and the plurality of data inserting units 20 are the same as those of the analog-to-digital conversion apparatus 100 described related to FIG. 8.

The filter units 22-1 to 22-3 provided corresponding to the ADCs 10 besides the reference ADC 10 have the filter coefficients that are obtained by processing the first correction coefficient (L1, L2, L3) previously described in a Fourier inverse transform method. By having such filter coefficients, it is possible to offset a spurious component, which is caused by the frequency characteristics of the plurality of ADCs 10, of each digital data in the synthesizing unit 24.

Moreover, the filter unit 22-0 has the filter coefficient that is obtained by processing the second correction coefficient $(1/\Sigma a_N(0) \times L_N)$ previously described in a Fourier inverse transform method. In this way, it is possible to correct an amplitude error caused by passing the filter units 22-1 to 22-3.

Figure 13:
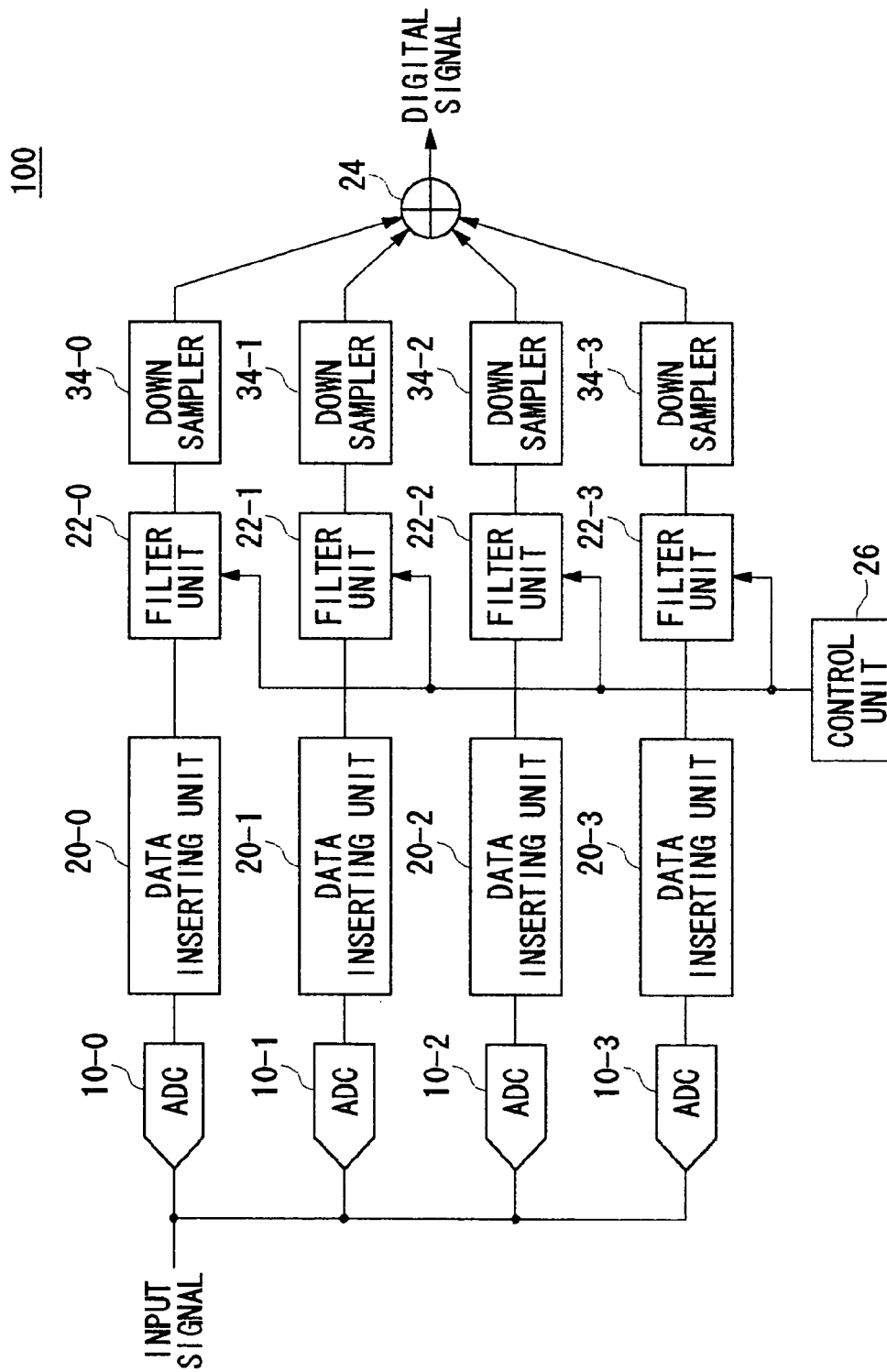
FIG. 13 is a view showing another example of a configuration of the analog-to-digital conversion apparatus.

FIG. 13 is a view showing another example of a configuration of the analog-to-digital conversion apparatus 100. The analog-to-digital conversion apparatus 100 in this example further includes a plurality of down samplers 34-0 to 34-3 (hereinafter, generally referred to as 34) in addition to a configuration of the analog-to-digital conversion apparatus 100 explained in FIG. 8.

The plurality of down samplers 34 is provided corresponding to the plurality of ADCs 10, and down-samples the zero-inserted data output from the corresponding filter units 22 to output the data to the synthesizing unit 24. A data insertion in each data inserting unit 20 is equal to up-sampling each digital data. Assuming that an up-sampling ratio in the data inserting unit 20 is U, a down-sampling ratio in each down sampler 34 is D, and a sampling frequency in each ADC 10 is fs, the sampling frequency of the digital signal output from the synthesizing unit 24 is 4 fs×U/D, and thus it is possible to sample the digital signal in arbitrary sampling frequency. In this case, it is preferable that the filter unit 22 has the filter coefficients according to the up-sampling ratio U and the down-sampling ratio D. For example, in a spectrum of digital data, an aliasing component is caused by up-sampling and a slope of fundamental wave and a slope of higher harmonic wave overlap by down-sampling. For this reason, it is preferable that the filter unit 22 has a predetermined cut-off frequency in order to remove the aliasing component or the overlap of slopes.

It is preferable that each filter unit 22 has a filter coefficient that is obtained by processing the filter coefficient to realize the predetermined cut-off frequency and the filter coefficient according to the frequency characteristic of ADC 10 described in FIGS. 8 to 13 by convolution integral.

Figure 14A:
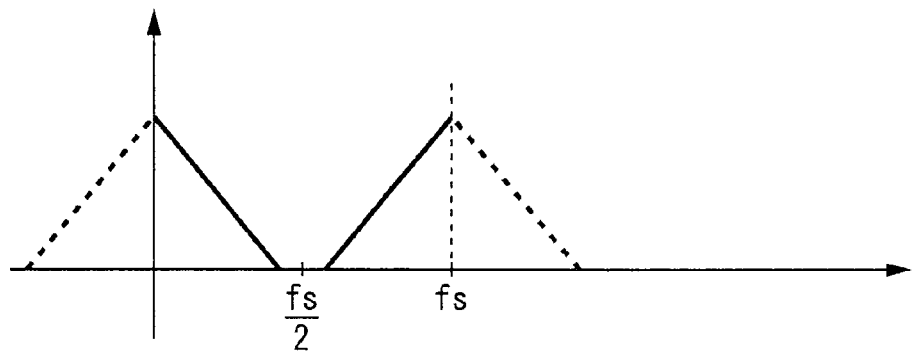
FIGS. 14A to 14C are views exemplary showing a spectrum of digital data when up-sampling the digital data.
Figure 14B:
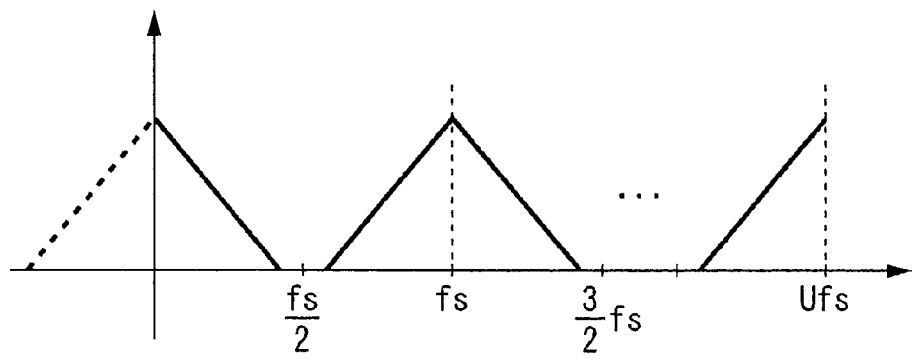
Figure 14C:
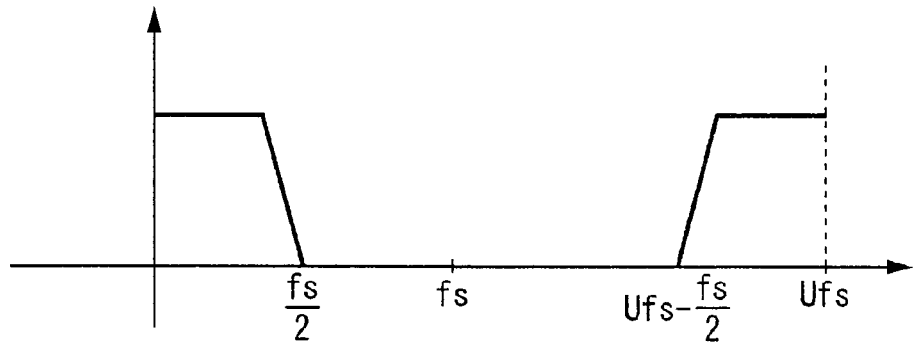

FIGS. 14A to 14C are views exemplary showing a spectrum of digital data when up-sampling the digital data. Assuming that the sampling frequency of each ADC 10 is fs, total sampling frequency is 4 fs when performing interleave-sampling using four ADCs 10. In this case, as shown in FIG. 14A, the spectrum of digital data shows an aliasing component in the frequency of 4 fs. In order to remove such an aliasing component, for example, it is preferable that a filter having a pass band of [−2 fs, 2 fs] or [0, 4 fs] is used.

When up-sampling the digital data at the up-sampling ratio U, as shown in FIG. 14B, an aliasing component occurs every 4 fs in the band [0, 4 Ufs]. In order to remove such an aliasing component, it is preferable that the up-sampled digital data are band-limited using an anti-imaging filter of which pass bands are [0, 2 fs] and [4 Ufs−2 fs, 4 Ufs] as shown in FIG. 14C.

Figure 15A:
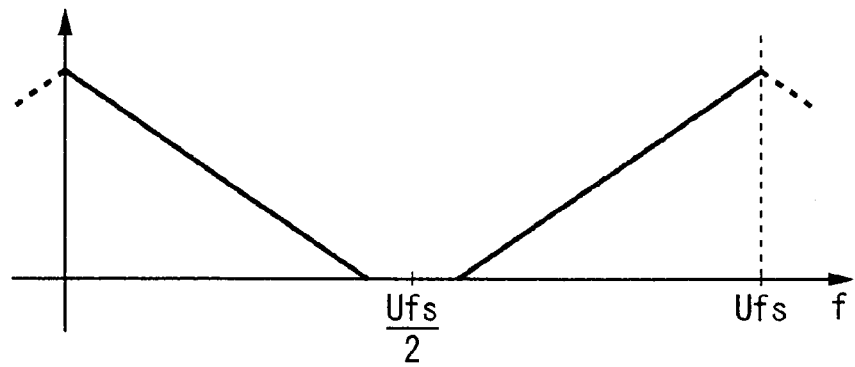
FIGS. 15A to 15C are views exemplary showing a spectrum of digital data when down-sampling the digital data.
Figure 15B:
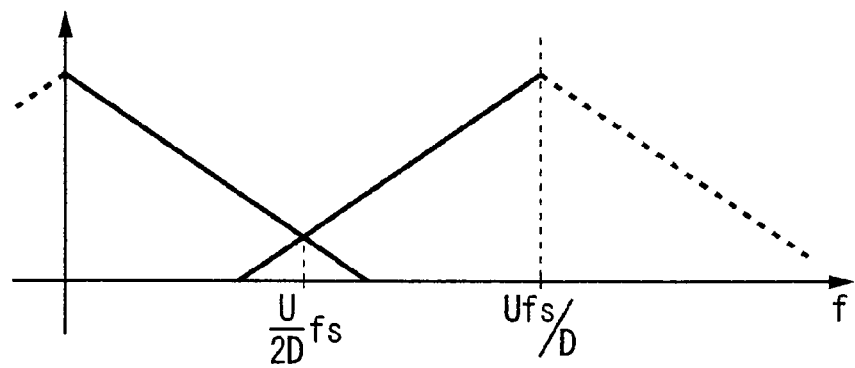
Figure 15C:
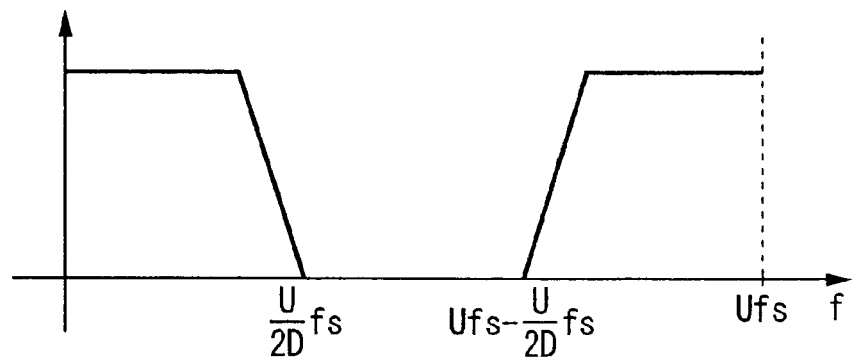

FIGS. 15A to 15C are views exemplary showing a spectrum of digital data when down-sampling the digital data. A spectrum of the digital data that passed through the filter explained in FIG. 14C has a higher harmonic component in the frequency 4 Ufs as shown in FIG. 15A. When down-sampling such a digital data at the down-sampling ratio D, the frequency of higher harmonic wave is shifted to 4 Ufs/D.

In the spectrum of digital signal after down-sampling, as shown in FIG. 15B, a slope of fundamental wave and a slope of higher harmonic wave are overlapped in the vicinity of the frequency 2 UFs/D. In order to remove the overlap, it is preferable that the digital data before down-sampling are band-limited using a filter of which pass bands are [0, 2 Ufs/D] and [4 Ufs−2 Ufs/D, 4 Ufs].

In other words, it is preferable that the filter units 22 explained in FIG. 13 have the pass bands shown in FIGS. 14C and 15C. For example, the filter units 22 may have a narrower pass band among the pass bands shown in FIGS. 14C and 15C. Since the cut-off frequency in FIG. 14C is 2 fs and the cut-off frequency in FIG. 15C is 2 Ufs/D, magnitude relation for U and D decides whether either of the pass bands shown in FIGS. 14C and 15C is a narrow-band.

Each filter unit 22 has a filter coefficient that is obtained by processing the filter coefficient to realize such a pass band and the filter coefficient according to the frequency characteristic of ADC 10 described in FIGS. 8 to 13 by convolution integral. By such a configuration, it is possible to sample an analog signal in arbitrary sampling frequency with high precision.

Moreover, although in FIG. 13 the down sampler 34 is provided corresponding to a configuration of FIG. 8, even in a configuration shown in FIG. 12, it is possible to sample an analog signal in arbitrary sampling frequency by providing the down sampler 34. For example, in a configuration explained in FIG. 12, the data inserting unit 20 having arbitrary up-sampling ratio U is provided before the filter unit 22-0 and the down sampler 34 having arbitrary down-sampling ratio D is provided behind the filter unit 22-0. Then, since the filter unit 22-0 has a filter coefficient that is obtained by processing the filter coefficient according to the up-sampling ratio U and the down-sampling ratio D and the filter coefficient according to the frequency characteristic of ADC 10 described in FIG. 12 by convolution integral, it is possible to sample an analog signal in arbitrary sampling frequency with high precision. In such a configuration, an arbitrary natural number may be set as U and D. In this way, it is possible to sample a signal in sampling frequency according to arbitrary rational ratio U/D.

Figure 16:
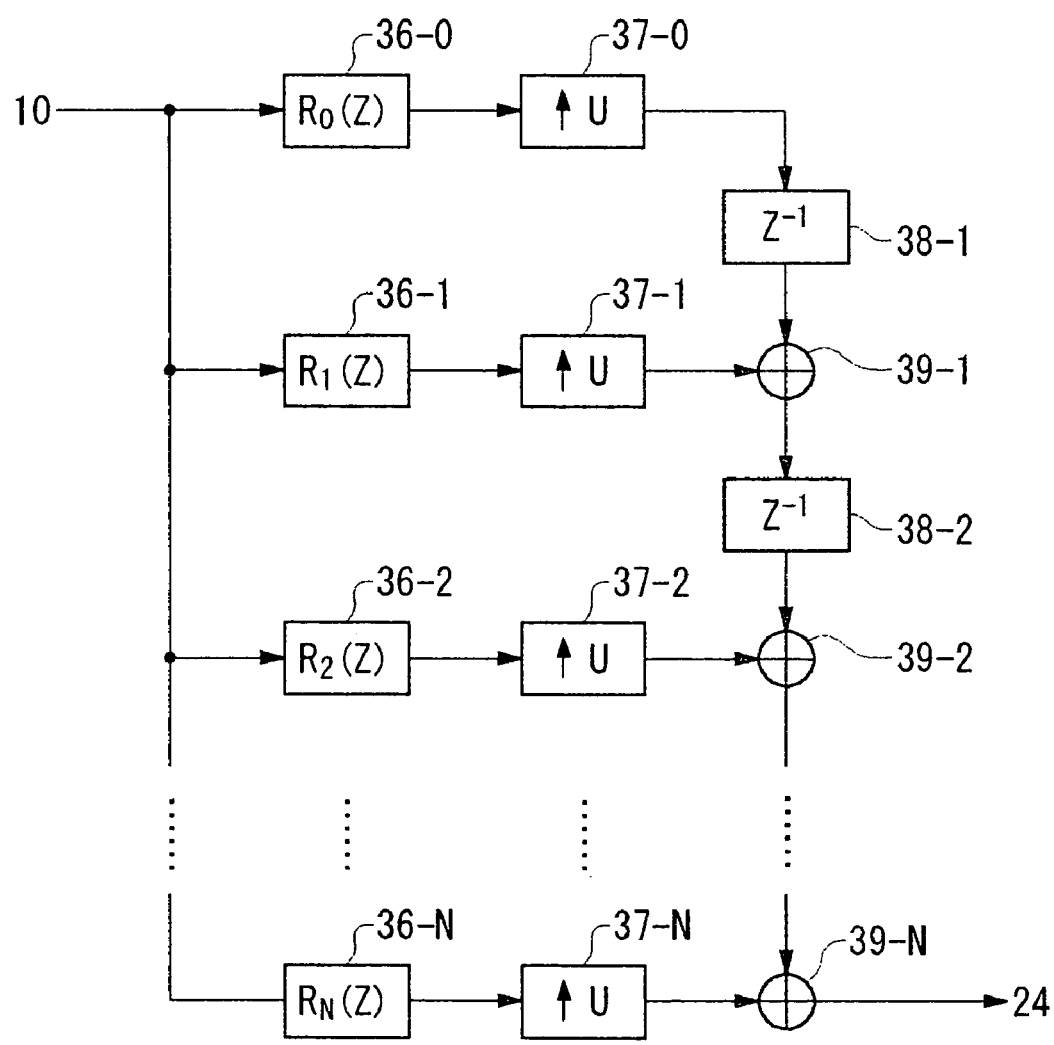
FIG. 16 is a view exemplary showing a configuration of a filter having a polyphase configuration, which functions as a data inserting unit and a filtering unit.

FIG. 16 is a view exemplary showing a configuration of a filter 35 having a polyphase configuration, which functions as the data inserting unit 20 and the filter unit 22. In other words, the combination of the data inserting unit 20 and the filter unit 22 can be realized with one filter 35 having a polyphase configuration. According to the polyphase configuration in this example, the up-sampling is performed after performing a convolution calculation as a filter calculation.

The filter 35 has a plurality of convolution arithmetic units 36-0 to 36-N (hereinafter, generally referred to as 36), a plurality of up samplers 37-0 to 37-N (hereinafter, generally referred to as 37), a plurality of delay elements 38-1 to 38-N (hereinafter, generally referred to as 38), and a plurality of addition units 39-1 to 39-N (hereinafter, generally referred to as 39).

The plurality of convolution arithmetic units 36 is provided in parallel, and divides the signal output from the corresponding ADC 10 and respectively receives them. Moreover, the plurality of convolution arithmetic units 36 performs the same convolution calculation as that of the filter unit 22.

The plurality of up samplers 37 is provided corresponding to the plurality of convolution arithmetic units 36. Each up sampler 37 increases the frequency of the signal output from the corresponding convolution arithmetic unit 36. For example, each up sampler 37 inserts data with data value zero into the signal output from the corresponding convolution arithmetic unit 36 by a predetermined number. Each up sampler 37 may be equal to the data inserting unit 20.

The plurality of addition units 39 is provided corresponding to the plurality of up samplers 37, and sequentially adds the signal output from each up sampler 37 and transmits the result. Moreover, the delay elements 38 are respectively provided on the upper side of each addition unit 39, and delay the signal output from the corresponding up sampler 37 by one period of the signal to supply the result to the addition units 39.

Since the filter 35 performs the up-sampling after the convolution calculation, it is possible to reduce an amount of convolution calculation in comparison with the convolution calculation for the up-sampled signal.

Figure 17:
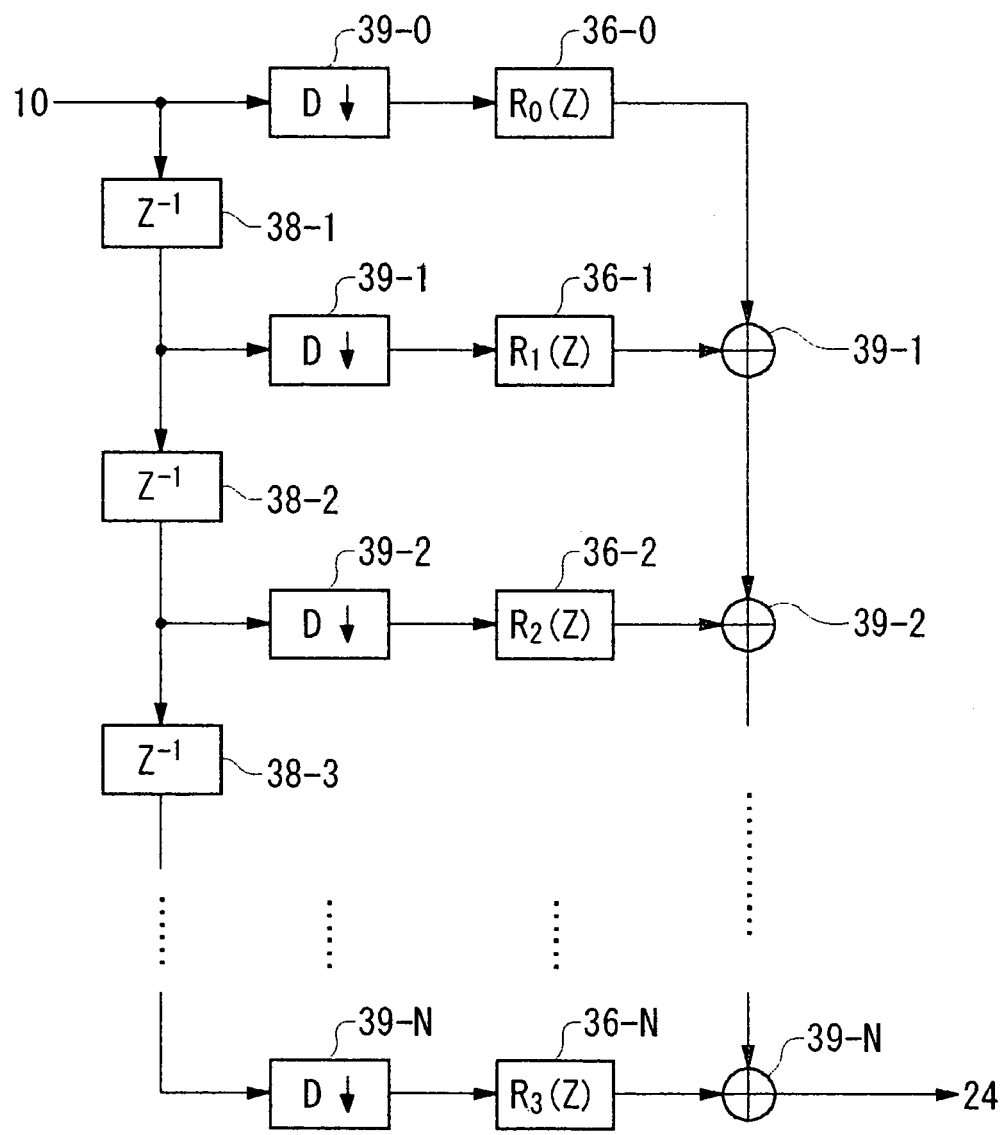
FIG. 17 is a view exemplary showing a configuration of a filter having a polyphase configuration, which functions as a filter unit and a down sampler.

FIG. 17 is a view exemplary showing a configuration of the filter 35 having a polyphase configuration, which functions as the filter unit 22 and the down sampler 34. In other words, the combination of the filter unit 22 and the down sampler 34 can be realized with one filter 35 having a polyphase configuration. According to the polyphase configuration in this example, a convolution calculation as a filter calculation is performed after performing the down-sampling.

The filter 35 has a plurality of convolution arithmetic units 36-0 to 36-N (hereinafter, generally referred to as 36), a plurality of down samplers 39-0 to 39-N (hereinafter, generally referred to as 39), a plurality of delay elements 38-1 to 38-N (hereinafter, generally referred to as 38), and a plurality of addition units 39-1 to 39-N (hereinafter, generally referred to as 39).

The plurality of convolution arithmetic units 36 has the same function as that of the plurality of convolution arithmetic units 36 explained in FIG. 16.

The plurality of down samplers 37 is provided corresponding to the plurality of convolution arithmetic units 36. Each down sampler 37 divides and receives the signal output from the corresponding ADC 10, and decreases the frequency of the received signal. For example, each down sampler 39 may be equal to the down sampler 34 explained in FIG. 13.

The plurality of delay elements 38 is provided corresponding to the plurality of down samplers 39, and sequentially delay the signals input to each down sampler 39 by one period of the signal to supply the result to each down sampler 39.

The plurality of addition units 39 is equal to the addition unit 39 explained in FIG. 16.

Since the filter 35 performs the down-sampling before the convolution calculation, it is possible to reduce an amount of convolution calculation in comparison with the down-sampling after the convolution calculation.

Moreover, the filter 35 may be a combination of configurations described in FIGS. 16 and 17. In other words, the filter 35 may function as the data inserting unit 20, the filter unit 22, and the down sampler 34 explained in FIG. 13. In this case, the filter 35 performs the convolution calculation after the down-sampling and performs the up-sampling after the convolution calculation.

Figure 18:
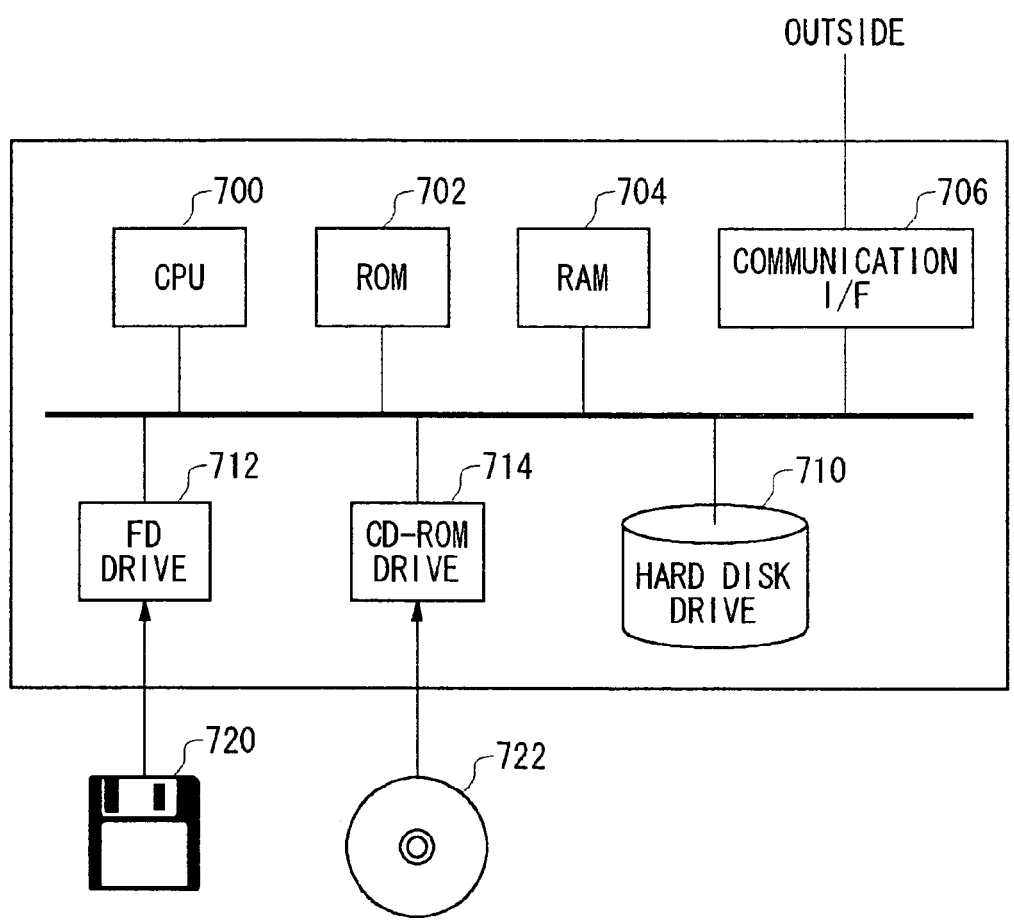
FIG. 18 is a view exemplary showing a a configuration of a computer that stores a program making the analog-to-digital conversion apparatus function.

FIG. 18 is a view exemplary showing a configuration of a computer 400 that stores a program causing the analog-to-digital conversion apparatus 100 to function. In this example, the computer 400 stores a program making the analog-to-digital conversion apparatus 100 function as described in FIGS. 1 to 17. The computer 400 may be a workstation controlling the analog-to-digital conversion apparatus 100, or may function as the control unit 26.

The computer 400 includes a CPU 700, a ROM 702, a RAM 704, a communication interface 706, a hard disk drive 710, a FD drive 712, and a CD-ROM drive 714. The CPU 700 operates based on a program stored on the ROM 702, the RAM 704, the hard disk 710, the FD disk 720, and/or the CD-ROM 722.

The communication interface 706 communicates with, e.g., the analog-to-digital conversion apparatus 100 to send and receive data. The hard disk drive 710 as an example of a storing unit stores setting information and a program to cause the central processing unit 700 to operate. The ROM 702, the RAM 704, and the hard disk drive 710 store a program causing the analog-to-digital conversion apparatus 100 to function as the analog-to-digital conversion apparatus 100 described related to FIGS. 1 to 17. Moreover, the program may be stored on the flexible disk 720, the CD-ROM 722, the hard disk drive 710, etc.

The FD drive 712 reads the program from the flexible disk 720 and provides it to the CPU 700. The CD-ROM drive 714 reads the program from the CD-ROM 722 and provides it to the CPU 700.

Moreover, the program may be read from a recording medium and stored on a RAM to be executed, or may be read from a recording medium to be once installed in a hard disk drive and stored on a RAM to be executed. Furthermore, the program may be stored on single recording medium, or may be stored on a plurality of recording media. Moreover, a program stored on the recording medium may provide each of the functions in association with an operating system. For example, a program may request an execution of all or some of the functions to an operating system, and provide the function based on an answer from the operating system.

It is possible to use an optical recording medium such as a DVD and a PD, a magneto-optical recording medium such as an MD, a tape medium, a magnetic recording medium, an IC card, and a semiconductor memory such as a miniature card besides a flexible disk and a CD-ROM as a recording medium storing a program. Moreover, a storing unit such as a hard disk or a RAM that is provided in a server system connected to a private telecommunication network, an Internet, etc. may be used as a recording medium.

Although the present invention has been described by way of an exemplary embodiment, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to the present invention, it is possible to remove a spurious component caused by the frequency characteristic of the ADC in the analog-to-digital conversion apparatus that operates in an interleaving method using the plurality of ADCs.

What is claimed is:

1. An analog-to-digital conversion apparatus correcting digital signals output from a plurality of analog-to-digital converters that is provided in parallel and samples analog signals in different timing by a predetermined phase, the analog-to-digital conversion apparatus comprising:
    a plurality of data inserting units that is provided corresponding to the plurality of analog-to-digital converters and outputs zero-inserted data that is made by respectively inserting data with data value zero between the digital data output from the respectively corresponding analog-to-digital converters by a predetermined number;
    a synthesizing unit that respectively synthesizes the zero-inserted data to generate the digital signal; and
    a plurality of filter units that is provided corresponding to the plurality of analog-to-digital converters, has filter coefficients based on a frequency characteristic of each of the analog-to-digital converters so that the digital signal generated form said synthesizing unit is a digital signal obtained when the frequency characteristics of the plurality of analog-to-digital converters are the same as one another, and passes through the corresponding zero-inserted data to supply the data to said synthesizing unit.

2. The analog-to-digital conversion apparatus as claimed in claim 1, wherein said data inserting unit respectively inserts data with data value zero between the digital data every the predetermined phase.

3. The analog-to-digital conversion apparatus as claimed in claim 1, wherein each of said filter units has the filter coefficient based on a first correction coefficient of a frequency domain to be multiplied by a signal within the corresponding frequency domain so that a spurious component caused by the frequency characteristics of the plurality of analog-to-digital converters is removed when converting each of the zero-inserted data into the signal within the frequency domain to synthesize the signals.

4. The analog-to-digital conversion apparatus as claimed in claim 3, wherein each of said filter units has the filter coefficient that is obtained by performing Fourier inverse transform on the first correction coefficient defined for each division band that is made by dividing a frequency band of the digital signal by the number of the analog-to-digital converters.

5. The analog-to-digital conversion apparatus as claimed in claim 3, wherein each of said filter units has the filter coefficient further based on a second correction coefficient to correct a phase error of the signal within the frequency domain, which is caused by multiplying the signal within the frequency domain by the first correction coefficient.

6. The analog-to-digital conversion apparatus as claimed in claim 5, wherein each of said filter units has the filter coefficient that is obtained by performing Fourier inverse transform on a coefficient obtained by multiplying the first correction coefficient by the second correction coefficient, the first correction coefficient and the second correction coefficient being respectively defined for each division band that is made by dividing the frequency band of the digital signal by the number of the analog-to-digital converters.

7. The analog-to-digital conversion apparatus as claimed in claim 6, wherein each of said filter units has the filter coefficient that is obtained by multiplying a predetermined window function by a coefficient obtained by performing Fourier inverse transform on the coefficient obtained by multiplying the first correction coefficient by the second correction coefficient.

8. The analog-to-digital conversion apparatus as claimed in claim 7, further comprising:
    a Fourier transform unit that respectively converts the filter coefficients of said filter units into frequency characteristics of the frequency domain;
    an error computing unit that compares the frequency characteristic of each of said filter units with a reference frequency characteristic previously supplied to compute a squared error; and
    an adjusting unit that adjusts a width of the window function in a frequency axis in regard to the filter coefficient corresponding to the frequency characteristic when the squared error is not within a predetermined range.

9. The analog-to-digital conversion apparatus as claimed in claim 7, further comprising:
    a Fourier transform unit that respectively converts the filter coefficients of said filter units into frequency characteristics of the frequency domain;
    an error computing unit that compares the frequency characteristic of each of said filter units with reference frequency characteristics previously supplied to compute a squared error; and
    an adjusting unit that adjusts a shape of the window function in regard to the filter coefficient corresponding to the frequency characteristic when the squared error is not within a predetermined range.

10. The analog-to-digital conversion apparatus as claimed in claim 1, further comprising a plurality of down samplers that is provided corresponding to the plurality of analog-to-digital converters and samples the zero-inserted data output from the corresponding filter units to supply the sampled data to said synthesizing unit.

11. An analog-to-digital conversion apparatus correcting digital signals output from a plurality of analog-to-digital converters that is provided in parallel and samples analog signals in different timing by a predetermined phase, the analog-to-digital conversion apparatus comprising:
    a plurality of data inserting units that is provided corresponding to the analog-to-digital converters besides a predetermined reference analog-to-digital converter among the plurality of analog-to-digital converters and outputs zero-inserted data that is made by respectively inserting data with data value zero between the digital data output from the respectively corresponding analog-to-digital converters by a predetermined number;

a synthesizing unit that respectively synthesizes the zero-inserted data;

a plurality of first filter units that is provided corresponding to the analog-to-digital converters besides a predetermined reference analog-to-digital converter among the plurality of analog-to-digital converters, has a filter coefficient based on a first correction coefficient of a frequency domain to be multiplied by a signal within the corresponding frequency domain so that a spurious component caused by the frequency characteristics of the plurality of analog-to-digital converters is removed when converting each of the zero-inserted data into the signal within the frequency domain to synthesize the signals, and passes through the corresponding zero-inserted data to supply the data to said synthesizing unit; and a second filter unit that has the filter coefficient based on a second correction coefficient to correct a phase error of the signal within the frequency domain, which is caused by multiplying the signal within the frequency domain by the first correction coefficient, and passes through the data output from said synthesizing unit to generate the digital signal.

12. A program stored on a recordable medium executable so as cause an analog-to-digital conversion apparatus to correct digital signals output from a plurality of analog-to-digital converters that is provided in parallel and samples analog signals in different timing by a predetermined phase, the program causing the analog-to-digital conversion apparatus function as:

a plurality of data inserting units that is provided corresponding to the plurality of analog-to-digital converters and outputs zero-inserted data that is made by respectively inserting data with data value zero between the digital data output from the respectively corresponding analog-to-digital converters by a predetermined number;

a synthesizing unit that respectively synthesizes the zero-inserted data to generate the digital signal; and a plurality of filter units that is provided corresponding to the plurality of analog-to-digital converters, has filter coefficients based on a frequency characteristic of each of the analog-to-digital converters so that the digital signal generated form said synthesizing unit is a digital signal obtained when the frequency characteristics of the plurality of analog-to-digital converters are the same as one another, and passes through the corresponding zero-inserted data to supply the data to said synthesizing unit.

13. A program stored on a recordable medium executable so as to cause an analog-to-digital conversion apparatus to correct digital signals output from a plurality of analog-to-digital converters that is provided in parallel and samples analog signals in different timing by a predetermined phase, the program causing the analog-to-digital conversion apparatus function as:

a plurality of data inserting units that is provided corresponding to the plurality of analog-to-digital converters and outputs zero-inserted data that is made by respectively inserting data with data value zero between the digital data output from the respectively corresponding analog-to-digital converters by a predetermined number;

a synthesizing unit that respectively synthesizes the zero-inserted data;

a plurality of first filter units that is provided corresponding to the analog-to-digital converters besides a predetermined reference analog-to-digital converter among the plurality of analog-to-digital converters, has a filter coefficient based on a first correction coefficient of a frequency domain to be multiplied by a signal within the corresponding frequency domain so that a spurious component caused by the frequency characteristics of the plurality of analog-to-digital converters is removed when converting each of the zero-inserted data into the signal within the frequency domain to synthesize the signals, and passes through the corresponding zero-inserted data to supply the data to said synthesizing unit; and a second filter unit that has the filter coefficient based on a second correction coefficient to correct a phase error of the signal within the frequency domain, which is caused by multiplying the signal within the frequency domain by the first correction coefficient, and passes through the data output from said synthesizing unit to generate the digital signal.

14. The analog-to-digital conversion apparatus as claimed in claim 1, wherein said filter units respectively comprise a filter having a polyphase configuration functioning as said zero inserting unit and said filter unit corresponding to said zero inserting unit.

15. The analog-to-digital conversion apparatus as claimed in claim 10, wherein said filter units respectively comprise a filter having a polyphase configuration functioning as said filter unit and said down sampler corresponding to said filter unit.

* * * * *